United States Patent [19]

Johannsmeier et al.

[11] Patent Number: 4,597,664

[45] Date of Patent: Jul. 1, 1986

[54] STEP-AND-REPEAT PROJECTION ALIGNMENT AND EXPOSURE SYSTEM WITH AUXILIARY OPTICAL UNIT

[75] Inventors: Karl-Heinz Johannsmeier, Los Altos; Edward H. Phillips, Middletown, both of Calif.

[73] Assignee: Optimetrix Corporation, Mountain View, Calif.

[21] Appl. No.: 615,595

[22] Filed: May 31, 1984

Related U.S. Application Data

[60] Division of Ser. No. 289,790, Aug. 3, 1981, Pat. No. 4,452,526, which is a continuation of Ser. No. 126,007, Feb. 29, 1980, abandoned.

[51] Int. Cl.[4] .............................................. G03B 27/52
[52] U.S. Cl. ......................................... 355/43; 355/53
[58] Field of Search ..................... 33/180; 355/43, 53, 355/54, 46, 1, 18, 67, 32; 354/4

[56] References Cited

U.S. PATENT DOCUMENTS

| | | | |
|---|---|---|---|
| 3,192,844 | 7/1965 | Szasz et al. | 355/78 |
| 3,461,566 | 8/1969 | Gerstner | 33/180 |
| 3,476,476 | 11/1969 | Chitayat | 355/1 |
| 3,563,648 | 2/1971 | Baggaley et al. | 355/46 |
| 3,610,750 | 10/1971 | Lewis et al. | 355/43 |
| 3,704,946 | 12/1972 | Brault et al. | 355/46 |
| 3,716,296 | 2/1973 | Springer et al. | 355/53 |
| 3,853,398 | 12/1974 | Kano | 355/43 |
| 3,876,301 | 4/1975 | Kosugi | 355/53 |
| 3,917,399 | 11/1975 | Buzawa et al. | 355/43 |

(List continued on next page.)

FOREIGN PATENT DOCUMENTS

| | | |
|---|---|---|
| 0017759 | 10/1980 | European Pat. Off. . |
| 0017044 | 10/1980 | European Pat. Off. . |
| 2009284 | 9/1970 | Fed. Rep. of Germany . |
| 2817364 | 10/1978 | Fed. Rep. of Germany . |
| 1508408 | 11/1967 | France . |
| 2082213 | 10/1971 | France . |
| 1382148 | 1/1975 | United Kingdom ................. 355/45 |

OTHER PUBLICATIONS

Patent Abstracts of Japan, vol. 2, No. 92, Jul. 28, 1978, p. 4306 E, JP-A-53-56975.
Solid State Technology, vol. 23, No. 8, Aug. 1980, "The Unique Fully Automatic Direct Wafer Steppers from Optimetrix are now in Production", Circle 93.

Primary Examiner—Richard A. Wintercorn
Attorney, Agent, or Firm—Roland I. Griffin

[57] ABSTRACT

A step-and-repeat alignment and exposure system is provided with an adjustable holder for holding a main reticle, a main optical unit including a projection lens for producing an image of the main reticle at an image plane, a stage movable along coordinate axes adjacent to the image plane, and a holder rotatably mounted on the stage for holding a semiconductive wafer to be aligned with respect to the image of the main reticle. The system is further provided with an adjustable holder for holding an auxiliary reticle, a single channel auxiliary optical unit including a main objective lens for producing an image of the auxiliary reticle at the image plane, and a reference mark disposed on the stage and aligned with respect to the coordinate axes. The stage may be controlled for positioning the reference mark directly beneath either the projection lens or the main objective lens of the single channel auxiliary optical unit so that the images of both the main reticle and the auxiliary reticle may be aligned with respect to the reference mark and, hence, with respect to the coordinate axes, and so that the relative spacing between these images may be determined and checked from time to time. This permits the main optical unit and the auxiliary optical unit to be employed interchangeably in globally and precision region-by-region aligning the semiconductive wafer with respect to the coordinate axes prior to employing the projection lens in the photometric step-and-repeat printing of the image of the main reticle at each of an array of different regions on the semiconductive wafer. The system also includes a light source unit for selectively frontally illuminating the entire field of view of the main objective lens of the single channel auxiliary optical unit with white light not passing through the auxiliary reticle.

2 Claims, 21 Drawing Figures

U.S. PATENT DOCUMENTS

| | | | |
|---|---|---|---|
| 3,940,211 | 2/1976 | Johannsmeier | 355/53 |
| 3,984,186 | 10/1976 | Momose et al. | 355/45 |
| 4,011,011 | 3/1977 | Hemstreet et al. | 355/18 |
| 4,040,736 | 8/1977 | Johannsmeier | 355/43 |
| 4,057,347 | 11/1977 | Moriyama et al. | 355/67 |
| 4,110,762 | 8/1978 | Tigreat | 354/4 |
| 4,128,331 | 12/1978 | Nakamura | 355/32 |
| 4,367,046 | 1/1983 | Lacombat | 355/53 |
| 4,395,117 | 7/1983 | Suzuki | 355/45 |
| 4,422,755 | 12/1983 | Phillips | 355/43 |
| 4,443,096 | 4/1984 | Johannsmeier et al. | 355/53 |
| 4,452,526 | 6/1984 | Johannsmeier et al. | 355/43 |

STEP-AND-REPEAT PROJECTION ALIGNMENT AND EXPOSURE SYSTEM WITH AUXILIARY OPTICAL UNIT

This application is a divisional of U.S. patent application Ser. No. 289,790 filed Aug. 3, 1981 (and issued June 5, 1984, as U.S. Pat. No. 4,452,526), which is in turn a continuation of U.S. patent application Ser. No. 126,007 filed Feb. 29, 1980 (abandoned).

RELATED APPLICATIONS

The subject matter of this application is related to that of copending U.S. patent application Ser. No. 026,722 entitled IMPROVED STEP-AND-REPEAT PROJECTION ALIGNMENT AND EXPOSURE SYSTEM and filed on Apr. 3, 1979, now abandoned by Edward H. Phillips (which has been continued as U.S. patent application Ser. No. 396,099 filed on July 7, 1983, and issued as U.S. Pat. No. 4,473,293 on Sept. 25, 1984) and to that of copending U.S. patent application Ser. No. 053,995 entitled IMPROVED ALIGNMENT AND EXPOSURE SYSTEM WITH AN INDICIUM OF AN AXIS OF MOTION OF THE SYSTEM and filed on July 2, 1979, now abandoned by Karl-Heinz Johannsmeier (which has been continued as U.S. patent application Ser. No. 278,402 filed on June 29, 1981, and issued as U.S. Pat. No. 4,414,749 on Nov. 15, 1983). Both of these U.S. Patent Applications are assigned to the same assignee as the present application, are incorporated herein by reference, and are hereinafter referred to by serial number alone.

BACKGROUND AND SUMMARY OF THE INVENTION

This invention relates generally to step-and-repeat alignment and exposure systems utilizing a projection lens of the reduction type for the photometric printing of an image of a first object, such as a reticle, upon a second object, such as a semiconductive wafer, and, more specifically, to apparatus for use in such systems to facilitate alignment of the semiconductive wafer with respect to the reticle.

In U.S. patent applications Ser. Nos. 026,722 and 053,995 an improved step-and-repeat alignment and exposure system is disclosed including a main stage movable along orthogonal axes of motion of the system, another stage mounted above the main stage for holding a main reticle containing a level of microcircuitry, a substage mounted on the main stage and provided with a reference mark that may be employed to facilitate alignment of the main reticle or an image thereof with respect to the orthogonal axes of motion of the system, and a vacuum chuck mounted on the main stage for holding a semiconductive wafer (containing an array of different regions comprising inchoate semiconductive dice. The system enables the semiconductive wafer to be prealigned as a whole (i.e., globally aligned) with respect to the orthogonal axes of motion of the system and, hence, with respect to the main reticle or an image thereof, and then to be precisely aligned region by region with respect to the main reticle or an image thereof in order that the level of microcircuitry contained on the main reticle may be successively photometrically printed on the semiconductive wafer at each of those regions in alignment with other levels of microcircuitry previously or yet to be printed at each of those same regions. Thus, the system also includes a projection lens of the reduction type that may be employed to allow direct viewing and alignment of the reference mark with respect to the orthogonal axes of motion of the system during a reference mark set-up operation, of the semiconductive wafer with respect to the orthogonal axes of motion of the system during the global alignment operation, and of each region (when selected) of the semiconductive wafer with respect to the main reticle or an image thereof during the precision region-by-region alignment operation.

In addition, the system includes prealignment apparatus comprising a dual channel objective lens unit and a corresponding pair of prealignment reticles that may be employed to allow global alignment of the semiconductive wafer with respect to the orthogonal axes of motion of the system more conveniently than can be performed with the projection lens. The system further includes a fixed light source for illuminating the prealignment reticles and, hence, global alignment mark containing portions of the semiconductive wafer with nonexposure light during the global alignment operation (when performed with the prealignment apparatus), a controllable light source for selectively illuminating selected portions of the main reticle and, hence, of the semiconductive wafer with either exposure light of a wavelength for which the projection lens is corrected or nonexposure light of a different wavelength during the precision region-by-region alignment operation (and also during the global alignment operation, when performed with the projection lens), and a compensating lens that must be employed to compensate for the difference in wavelength of the exposure and nonexposure light when the latter is selected.

Although in this system the projection lens may normally be employed to allow direct viewing, global alignment, and precision region-by-region alignment of the semiconductive wafer, there are certain situations in which such direct viewing and alignment cannot be performed while employing the projection lens due to interference patterns that may be created in an image plane of the projection lens (for some photoresist coatings or other surface conditions of a semiconductive wafer being viewed in that image plane) at the wavelength of light for which the projection lens is corrected or compensated. There may also be situations in which such direct viewing and alignment may not be performed as conveniently while employing the projection lens, such as when nonexposure light is required for viewing and alignment. The controllable light source must then be switched to illuminate selected portions of the main reticle and, hence, of the semiconductive wafer with nonexposure light rather than exposure light, and the compensating lens must be switched into place to compensate for the difference in wavelength of the nonexposure light and the exposure light for which the projection lens is corrected.

Although the prealignment apparatus can be employed to perform global alignment of the semiconductive wafer with respect to the orthogonal axes of motion of the system in place of the projection lens, the prealignment apparatus cannot be employed to perform precision region-by-region alignment of the semiconductive wafer with respect to the main reticle or an image thereof. The reference mark, which is directly employed in the alignment of the main reticle or an image thereof with respect to the orthogonal axes of motion of the system, is located on the main stage at a position (adjacent to one side of the vacuum chuck)

spaced away from the prealignment apparatus such that the reference mark cannot be directly employed with the dual channel objective lens unit of the prealignment apparatus to align both prealignment reticles or images thereof with respect to the orthogonal axes of motion of the system and, hence, with respect to the main reticle or an image thereof during a prealignment reticle set-up or checking operation. It is therefore necessary to employ the projection lens in aligning a set-up wafer with respect to the orthogonal axes of motion of the system and the channel objective lens unit of the prealignment apparatus in aligning the prealignment reticles or images thereof with respect to the set-up wafer in order to perform a prealignment reticle set-up or checking operation. The prealignment reticles cannot be set up with sufficient precision in this manner to be employed in the precision region-by-region alignment operation. Moreover, a pair of prealignment reticles or images thereof cannot be aligned relative both to one another and to the main reticle or an image thereof with sufficient precision to be employed in the precision region-by-region alignment operation. The foregoing factors also limit the accuracy with which the global alignment operation can be performed while employing the prealignment apparatus.

Since the reference mark cannot be directly employed with both the projection lens and the dual channel objective lens unit of the prealignment apparatus in the main reticle alignment and prealignment reticle set-up operations, the alignment of the main reticle and the prealignment reticles or images thereof with respect to the orthogonal axes of motion of the system and with respect to one another cannot be conveniently checked. Moreover, it is not readily possible to check the relative spacing between the main reticle and the prealignment reticles or images thereof from time to time as would be desired to permit slight adjustments in the step-and-repeat positioning of the main stage to compensate for changes in that relative spacing and concomitantly in the relative spacing of adjacent regions of the semiconductive wafer due to changes in environmental conditions such as temperature and the like (i.e., to permit reconciliation of the system with environmental changes affecting the step-and-repeat positioning of the main stage). Thus, more careful environmental control is required than would otherwise be necessary if such reconciliation of the system were possible.

When employing the prealignment apparatus to perform the global alignment operation, the global alignment mark containing regions of the semiconductive wafer are illuminated by nonexposure light passing through the prealignment reticles from the fixed light source. However, it may sometimes be difficult to locate the global alignment marks (on the semiconductive wafer) to be aligned with respect to the prealignment reticles or images thereof since the global alignment marks may be masked by the prealignment reticles themselves and since the illumination passing through each prealignment reticle does not illuminate the entire field of view of the corresponding objective lens of the dual channel objective lens unit of the prealignment apparatus.

It is the principal object of the present invention to provide this step-and-repeat alignment and exposure system with an auxiliary optical unit that may be employed with a relocated reference mark to allow direct viewing, global alignment, and precision region-by-region alignment of the semiconductive wafer, for example, when the projection lens cannot be so employed or may not be so employed as conveniently.

Another object of the present invention is to provide a single channel auxiliary optical unit that may be employed with a corresponding single auxiliary reticle and with the relocated reference mark to allow direct global alignment of the semiconductive wafer with greater precision and fewer parts than the original prealignment apparatus, and to allow direct precision region-by-region alignment of the semiconductive wafer not possible with the original prealignment apparatus.

Another object of the present invention is to relocate the reference mark so that it can be directly employed both with the projection lens to align the main reticle or an image thereof with respect to the orthogonal axes of motion of the system and with the single channel auxiliary optical unit to align the corresponding single auxiliary reticle or an image thereof with respect to the orthogonal axes of motion of the system.

Another object of the present invention is to relocate the reference mark as in the immediately preceding object so that the reference mark can be conveniently employed at any time with the projection lens and with the single channel auxiliary optical unit to allow checking and adjustment, if necessary, of the alignment of the main reticle and the single auxiliary reticle or images thereof with respect to the orthogonal axes of motion of the system and, hence, with respect to one another, and also to allow checking for changes in the relative spacing between the main reticle and the single auxiliary reticle or images thereof and thereby permit reconciliation of the system, if necessary, with environmental changes causing changes in that relative spacing and affecting the step-and-repeat positioning of the main stage.

Another object of the present invention is to provide the step-and-repeat alignment and exposure system with a frame of reference that may be employed, for example, in reconcilation of the system as in the immediately preceding object.

Still another object of the present invention is to frontally illuminate the entire field of view of the single channel auxiliary optical unit with white nonexposure light (i.e., white light exclusive of any exposure wavelengths) that does not pass through the single auxiliary reticle and therefore illuminates a larger portion of the semiconductive wafer, when the auxiliary optical unit is employed in viewing and aligning the semiconductive wafer, than does the original fixed light source employed with the prealignment reticles.

These and other objects of the present invention are accomplished according to the illustrated preferred embodiment of the present invention by replacing the original prealignment apparatus of this step-and-repeat alignment and exposure system with a single channel auxiliary optical unit and with a single auxiliary reticle positioned above and axially aligned with a main objective lens of the single channel auxiliary optical unit, and by relocating the substage and the reference mark provided thereon at a position on the main stage (adjacent to the opposite side of the vacuum chuck from their original position) where the reference mark can be directly employed with the projection lens and with the single channel auxiliary optical unit in aligning the main reticle and the single auxiliary reticle or images thereof with respect to the orthogonal axes of motion of the system and, hence, with respect to each other. The step-and-repeat alignment and exposure system is also provided with a detector unit for determining an initial reference or home position of the main stage and facilitating reconcilation of the system with respect to that home position. In addition, the fixed light source originally employed for illuminating the prealignment reticles is replaced by an auxiliary light source unit for illuminating the single auxiliary reticle with white nonexposure light and for selectively frontally illuminating the entire field of view of the single channel auxiliary optical unit with white nonexposure light that does not pass through the single auxiliary reticle.

DESCRIPTION OF THE PREFERRED EMBODIMENT

Figure 1:
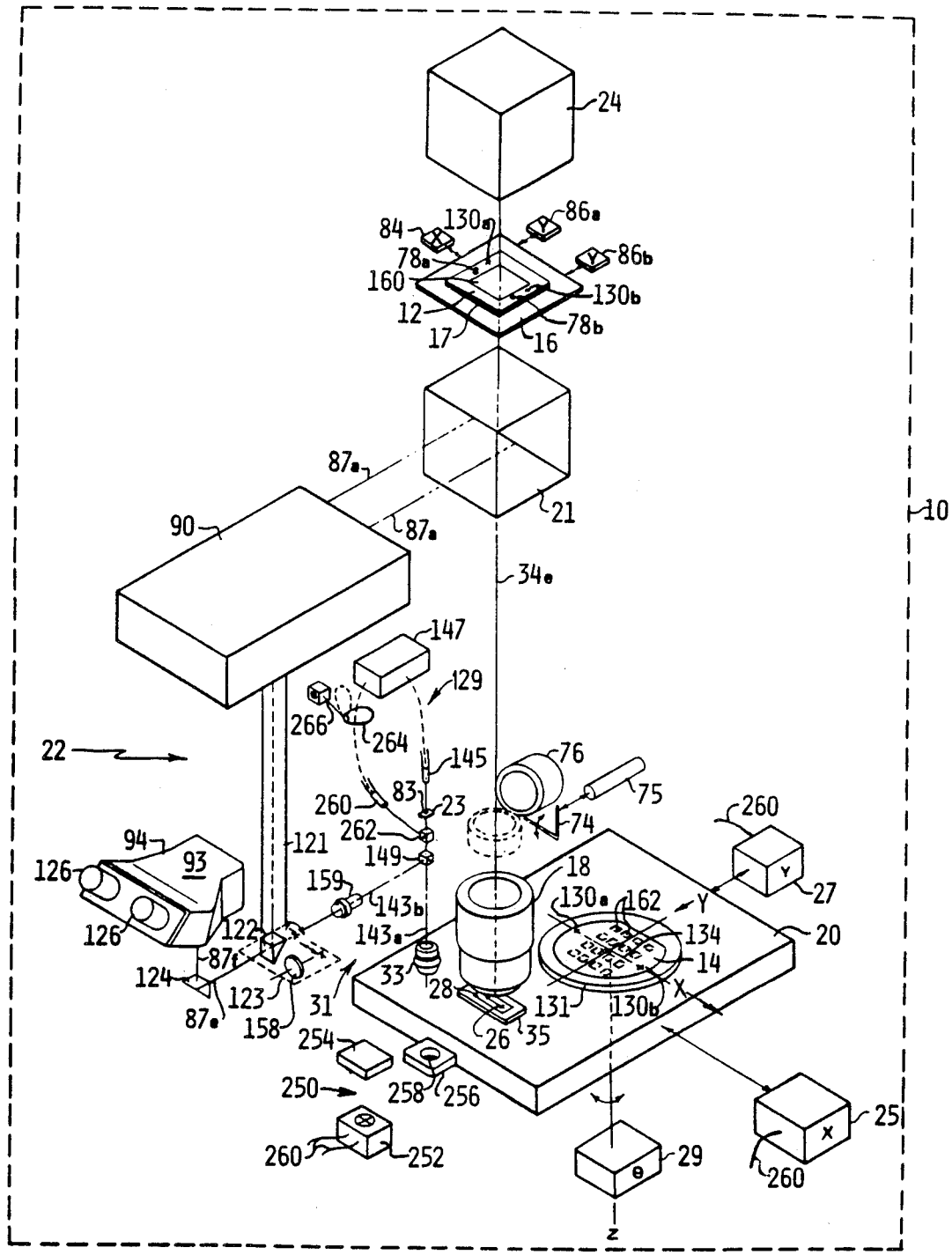
FIG. 1 is a perspective view in partially schematic form of a step-and-repeat alignment and exposure system incorporating a single channel auxiliary optical unit and a substage with a reference mark in accordance with the preferred embodiment of the present invention and showing the substage with the reference mark positioned directly beneath a projection lens of the system during a reference mark set-up or a main reticle alignment operation.
Figure 2:
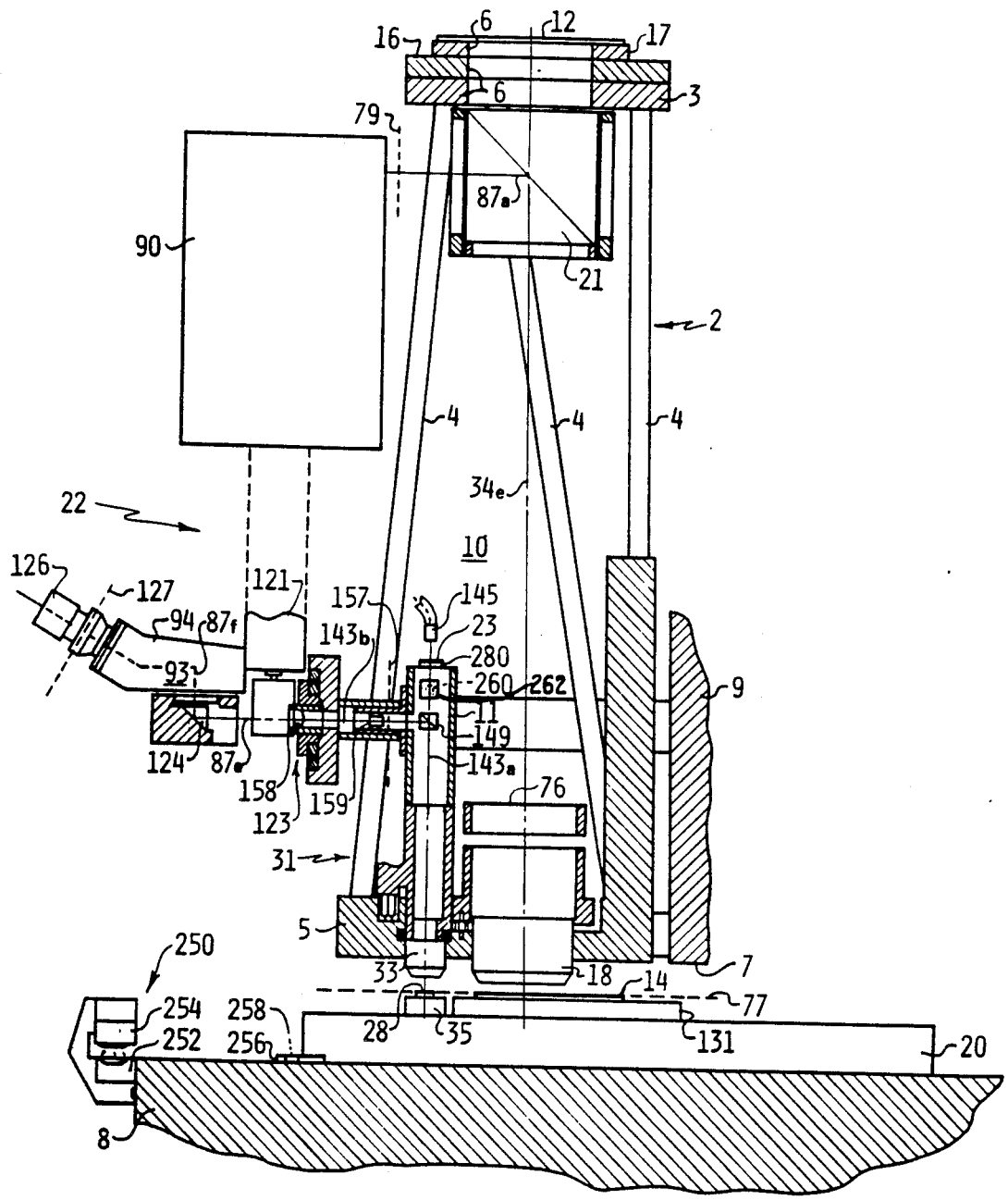
FIG. 2 is a half-sectional, partially cut-away elevational view of a portion of the step-and-repeat alignment and exposure system of FIG. 1 showing the substage with the reference mark positioned directly beneath a main objective lens of the single channel auxiliary optical unit during an auxiliary reticle set-up or checking operation.

Referring now to FIGS. 1 and 2, there is shown a precision step-and-repeat alignment and exposure system 10 for repeatedly printing one level of microcircuitry, contained on a first object, such as a main reticle 12, at an array of adjacent regions 162 of a second object, such as a semiconductive wafer 14, in alignment with other levels of microcircuitry previously printed or yet to be printed at those same regions. This system is constructed and operated in the same manner as the step-and-repeat alignment and exposure system disclosed in U.S. patent applications Ser. Nos. 026,722 and 053,995 except for the improvements described herein. Accordingly, the same parts in both systems are identified by the same reference numbers to facilitate cross reference to those patent applications.

Alignment and exposure system 10 includes a stage 16 for holding the main reticle 12, a 10:1 projection lens 18 for projecting an image of illuminated portions of the main reticle onto a reference mark 26 or the semiconductive wafer 14 in a first image plane 77 of the projection lens, a main stage 20 for positioning the reference mark or the semiconductive wafer with respect to the projected image of illuminated portions of the main reticle, a beam splitter 21 and a compound microscope 22 for viewing aerial images of portions of the reference mark or semiconductive wafer illuminated by the projected image of illuminated portions of the main reticle, and a controllable light source unit 24 for selectively illuminating different portions of the main reticle (with either illumination or exposure light) to permit viewing of those aerial images during alignment operations and to selectively expose a photosensitive film on the semiconductive wafer during step-and-repeat printing operations. In addition alignment and exposure system 10 includes a single auxiliary reticle 23, an auxiliary light source unit 129 for illuminating the auxiliary reticle, and a single channel auxiliary optical unit 31 (including a main objective lens 33) for viewing an image of a portion of the reference mark 26 or semiconductive wafer 14 illuminated by a projected image of the auxiliary reticle (the main stage 20 also being operable for positioning the reference mark or the semiconductive wafer with respect to the projected image of the auxiliary reticle).

With reference now particularly to FIG. 1, main stage 20 may comprise an interferometrically-controlled stage of the type shown and described in detail in copending U.S. patent application Ser. No. 015,713 entitled INTERFEROMETRICALLY CONTROLLED STAGE WITH PRECISELY ORTHOGONAL AXES OF MOTION, filed on Feb. 27, 1979, by Edward H. Phillips, assigned to the same assignee as the present application, and incorporated herein by reference (which has been continued as U.S. patent application Ser. No. 198,358 filed on Oct. 20, 1980, and issued as U.S. Pat. No. 4,311,390 on Jan. 19, 1982). As fully described in that application, main stage 20 may be moved along orthogonal X and Y axes to coordinate positions in a horizontal plane by X and Y axes servo drive units 25 and 27. These axes of motion of main stage 20 may therefore be employed as an absolute frame of reference, and are so employed, for alignment and exposure system 10. As hereinafter explained, reference mark 26 is employed as a visual indication of the orthogonal X and Y axes of motion of main stage 20 and, hence, of this absolute frame of reference.

Figure 3:
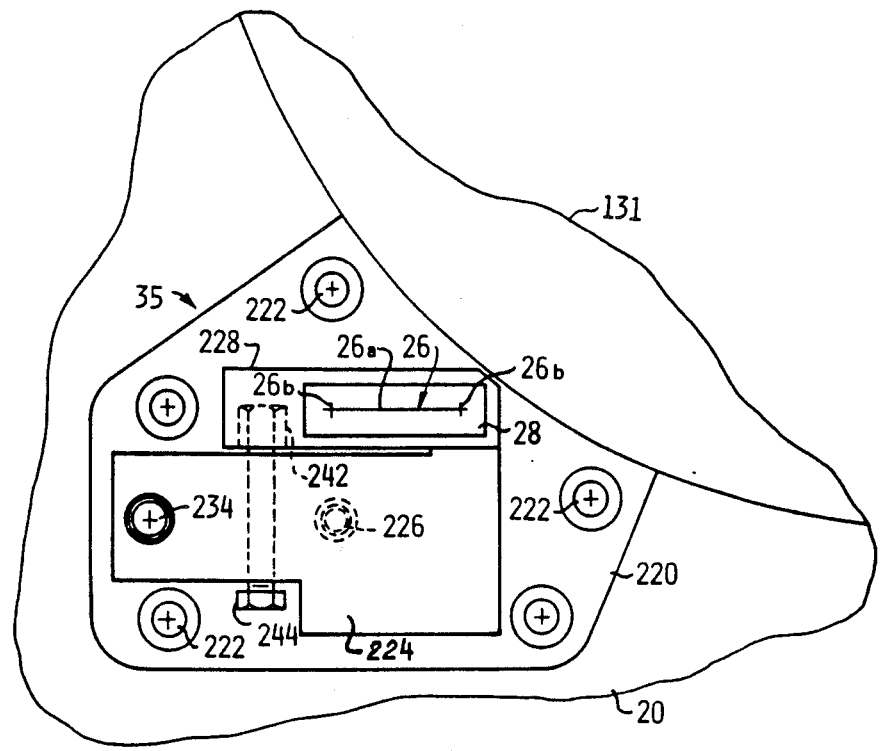
FIG. 3 is a top plan view of the substage and the reference mark employed in the step-and-repeat alignment and exposure system of FIGS. 1 and 2.

Reference mark 26 may be formed of bright chrome on a reference mark plate 28 fixedly mounted on a substage 35, which is in turn adjustably mounted on main stage 20. As best shown in FIG. 3, reference mark 26 may comprise a straight line 26a (of about 12.7 millimeters in length and about 4 microns in width), and a pair of identical tic marks 26b (of about 0.4 millimeters in length and about 4 microns in width). These tic marks 26b (spaced 10.3 millimeters apart center-to-center) symmetrically and orthogonally intersect line 26a near the opposite ends thereof.

Figure 4:
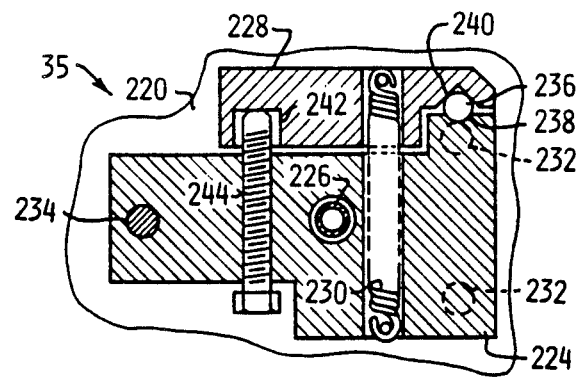
FIG. 4 is a partially cut away top plan view of the substage of FIG. 3.

With reference now particularly to FIGS. 3 and 4, substage 35 may comprise a base member 220 fixedly secured to main stage 20 by screws 222, a first adjustable support member 224 mounted on the base member 220, and a smaller second adjustable support member 228 mounted on the first adjustable support member. The first adjustable support member 224 is provided at one end thereof with a pair of ball bearings 232, one of which is seated in a conical recess formed in the top of base member 220 and in a matching, oppositely facing, conical recess formed in the bottom of the first adjustable support member, and the other of which is seated in a conical recess formed in the top of the base member and in a corresponding, oppositely-facing, V-shaped recess formed in the bottom of the first adjustable support member. In addition, the first adjustable support member 224 is provided at the other end thereof with an adjustment screw 234 screwed through a threaded screw hole in the first adjustable support member and into abutment with base member 220. The base member 220, the first adjustable support member 224, ball bearings 232, and adjustment screw 234 are firmly engaged by a tension spring 226 fixedly secured at one end to a central portion of the base member and fixedly secured at the other end to a central portion of the first adjustable support member. Similarly, the smaller second adjustable support member 228 is provided at one end thereof with a pair of ball bearings 236, one of which is seated in a conical recess formed in one side of the first adjustable support member 224 and in a matching, oppositely facing, conical recess formed in the adjoining side of the second adjustable support member, and the other of which is seated in a conical recess 238 formed in the same side of the first adjustable support member and in a corresponding oppositely facing, V-shaped recess 240 formed in the same adjoining side of the second adjustable support member. In addition, the smaller second adjustable support member 228 is provided at the other end thereof with a cylindrically recessed portion 242 disposed in abutment with an adjustment screw 244 screwed through a threaded screw hole in the first adjustable support member 224. The first and second adjustable support members 224 and 228, ball bearings 236, and adjustment screw 244 are firmly engaged by a tension spring 230 fixedly secured at one end to a central portion of the first adjustable support member and fixedly secured at the other end to a central portion of the second adjustable support member.

Reference mark plate 28 is fixedly secured to the top surface of the smaller second adjustable support member 228 by an adhesive or the like. Thus, by turning adjustment screw 234 to pivot the first adjustable support member 224 about ball bearings 232 and, hence, with respect to the plane of the upper surface of main stage 20, the upper surface of the smaller second adjustable support member 228 and of reference mark plate 28 provided thereon (both of which pivot with the first adjustable support member) may be adjusted with respect to that plane to position reference mark 26 provided on the upper surface of the reference mark plate in a plane parallel to the first image plane 77 (see FIG. 2) of projection lens 18. Concomitantly, by turning adjustment screw 244 to pivot the smaller second adjustable support member 228 about ball bearings 236 and, hence, angularly in a plane parallel to the plane of the upper surface of main stage 20, line 26a of reference mark 26 may be precisely aligned with respect to the X axis of motion of the main stage so that the reference mark serves as a visual indication of the orthogonal X and Y axes of motion of the main stage and thereby facilitates use of those axes of motion as an absolute frame of reference for alignment and exposure system 10.

As best shown in FIGS. 1 and 3, substage 35 is mounted on main stage 20 adjacent to a vacuum chuck 131 for holding the semiconductive wafer 14. Substage 35 is located at a position (forward and to the left side of vacuum chuck 131 as viewed in FIG. 1) where the reference mark 26 may be aligned with respect to the X axis of motion of main stage 20 and may be directly and efficiently employed with both projection lens 18 and single channel auxiliary optical unit 31. In initially setting up alignment and exposure system 10, substage 35 is manually adjusted by adjustment screws 234 and 244 to achieve the desired parallel-plane positioning of reference mark 26 and the desired alignment of line 26a of the reference mark. Although this substage adjustment operation should only have to be performed once during the life of alignment and exposure system 10, it may be advisable to check the parallel-plane positioning of reference mark 26 and the alignment of line 26a of the reference mark from time to time. The manner in which the substage adjustment operation is performed will be hereinafter described.

With reference now particularly to FIG. 1, controllable light source unit 24 is constructed in the same manner as described in detail in U.S. patent applications Ser. Nos. 026,722 and 053,995. It may be selectively employed either to direct or not to direct a beam of light downwardly along a vertically extending optical path 34e through main reticle 12 and beam splitter 21 to projection lens 18. When employed to direct a beam of light downwardly along that optical path, controllable light source unit 24 may be employed to selectively direct a beam of either green illuminating light (having a wavelength of about 547 nanometers) for illuminating but not exposing the photosensitive film on the semiconductive wafer (hereinafter referred to as illuminating or nonexposure light), or blue illuminating and exposure light (having a wavelength of about 436 nanometers) for both illuminating and exposing the photosensitive film on the semiconductive wafer (hereinafter simply referred to as exposure light). In addition, controllable light source unit 24 may be employed to selectively illuminate a pair of small circular areas (about two millimeters in diameter) disposed on the upper surface of main reticle 12 and containing only a corresponding pair of reticle or wafer alignment marks (hereinafter simply referred to as illuminating the reticle or wafer alignment marks of the main reticle), or an even smaller circular area disposed on the upper surface of the main reticle and containing a single smaller precision wafer alignment mark (hereinafter simply referred to as illuminating a precision wafer alignment mark of the main reticle), or an entire square central area disposed on the upper surface of the main reticle and containing the level of microcircuitry to be photometrically printed onto the semiconductive wafer 14 and any associated precision wafer alignment marks (hereinafter simply referred to as illuminating the central portion of the main reticle).

Figure 5:
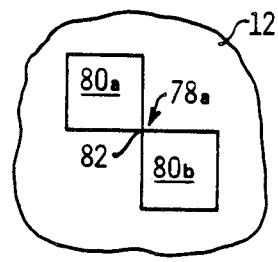
FIG. 5 is a top plan view of one of a pair of reticle alignment marks contained on each main reticle employed with the step-and-repeat alignment and exposure system of FIGS. 1 and 2.

Each main reticle 12 to be employed with alignment and exposure system 10 has a pair of oppositely-facing reticle alignment marks 78a and 78b spaced apart (103 millimeters center-to-center) along the X axis when the reticle is properly aligned on stage 16. As best shown in FIG. 5 each reticle alignment mark 78a or 78b may comprise a pair of light or transparent windows 80a and 80b (each about 0.75 millimeters square) on a dark or opaque field. These windows 80a and 80b are symmetrically disposed about the center 82 of the reticle alignment mark on opposite sides of a pair of orthogonal centerlines of the reticle alignment mark (one of those centerlines being coincident with a common centerline of both reticle alignment marks). Stage 16 is provided with a vacuum holder 17 (as best shown in FIG. 2) for releasably holding main reticle 12 in place, and is moved by X and differentially-controlled Y axes servo drive units 84, 86a, and 86b to adjust the X, Y, and $\theta$ orientation of the main reticle as required to precisely align images of the reticle alignment marks 78a and 78b of the main reticle with respect to reference mark 26 as hereinafter explained.

With reference now to both FIGS. 1 and 2, beam splitter 21 is mounted in the vertically extending optical path 34e so as to pass eighty percent of the light passing through main reticle 12 to projection lens 18, which is also mounted in that optical path. A compensating lens 76 is pivotally mounted adjacent to projection lens 18 and controlled by a crank 74 and an air cylinder 75 for movement out of the vertically extending optical path 34e (as shown in solid lines) when exposure light is passing therealong to the projection lens (as is normally the case), and for movement into that optical path (as shown in dashed lines) when illuminating light is passing therealong to the projection lens. The compensating lens 76 is employed to compensate for the difference in wavelength of the illuminating light and the exposure light since projection lens 18 is corrected for the exposure light only.

Projection lens 18 focuses the light passing through main reticle 12 at the first image plane 77 adjacent to main stage 20 and directly beneath the projection lens, thereby projecting images of illuminated portions of main reticle 12 (and, hence, of the reticle alignment marks 78a and 78b contained on the main reticle when they are illuminated by the controllable light source unit 24) onto whatever object is positioned in that image plane directly beneath the projection lens. The portions of that object onto which those images are projected are therefore illuminated by the light passing through the transparent portions of main reticle 12 (such as the reticle alignment marks 78a and 78b when they are illuminated). Twenty percent of the light reflected vertically upward from those illuminated portions of that object through projection lens 18 is reflected by beam splitter 21 along horizontally extending portions 87a of a dual optical path 87a-f to a second image plane 79 positioned the same optical distance from the beam splitter as is the main reticle 12 and positioned between the beam splitter and the objective lenses of a dual channel objective lens unit 90 of compound microscope 22. Projection lens 18 focuses this reflected light at the second image plane 79, thereby projecting an aerial image of those illuminated portions of the object positioned in the first image plane 77 directly beneath the projection lens (such as those portions illuminated by the projected images of the reticle alignment marks 78a and 78b contained on main reticle 12, when those reticle alignment marks are illuminated) to the second image plane.

Compound microscope 22 includes both the dual channel objective lens unit 90 and a binocular lens unit 93 employed with both the dual channel objective lens unit and the single channel auxiliary optical unit 31 as hereinafter explained. The dual channel objective lens unit 90 is constructed in the same manner as described in detail in U.S. patent applications Ser. Nos. 026,722 and 053,995. It includes a pair of objective lenses that may be controllably moved closer to one another or further apart and also together along the X axis and an orthogonal Z axis of alignment and exposure system 10 with respect to the second image plane 79 as desired for viewing any portions of an aerial image projected to that image plane. A downwardly extending portion 121 of dual channel objective lens unit 90 is optically coupled to a beam bender 122 mounted on a manually controlled X-axis slide 123 for locating that beam bender in an operative position along a horizontally extending portion 87e of dual optical path 87a-f (as shown in FIG. 1) whenever the dual channel objective lens unit is to be employed with binocular lens unit 93. In this operative position beam bender 122 deflects light passing through dual channel objective lens unit 90 forward along the horizontally extending portion 87e of dual optical path 87a-f to a beam bender 124. This beam bender 124 is fixedly mounted along the horizontally extending portion 87e of dual optical path 87a-f for deflecting light from beam bender 122 upward along a vertically extending portion 87f of dual optical path 87a-f to a pair of ocular lenses 126 of a binocular head 94, which is fixedly mounted along that portion of the dual optical path.

The various elements of dual channel objective lens unit 90 and binocular lens unit 93 are arranged along dual optical path 87a-f so that an aerial image viewed in the second image plane 79 by the dual channel objective lens unit is reimaged at another image plane 127 directly in front of ocular lenses 126. A frontal illumination system of the type shown and described in a copending U.S. patent application Ser. No. 113,375 entitled FRONTAL ILLUMINATION SYSTEM FOR SEMICONDUCTIVE WAFERS, filed on Jan. 18, 1979, by Edward H. Phillips, assigned to the same assignee as the present application, and incorporated herein by reference (which has been continued as U.S. patent application Ser. No. 388,147 filed on June 14, 1982, and issued as U.S. Pat. No. 4,422,755 on Dec. 27, 1983) may also be employed with binocular lens unit 93 or dual channel objective lens unit 90 to uniformily illuminate the entire field viewed on the semiconductive wafer 14 by compound microscope 22 through projection lens 18 without passing the illuminating light through main reticle 12.

As shown in FIG. 2 and shown and described in copending U.S. patent application Ser. No. 025,917, entitled OPTICAL FOCUSING SYSTEM, filed on Apr. 2, 1979, by Edward H. Phillips, assigned to the same assignee as the present application, and incorporated herein by reference (which has been continued as U.S. patent application Ser. No. 183,402 filed on Sept. 2, 1980, and issued as U.S. Pat. No. 4,383,757 on May 17, 1983), stage 16, beam splitter 21, and projection lens 18 (hence, also compensating lens 76) are securely mounted on a tower 2. This tower comprises an upper platform 3 on which stage 16 and beam splitter 21 are mounted, six upright rods 4 on which the upper platform is securely mounted, and a base 5 on which the rods 4 and the projection lens 18 (hence, also compensating lens 76) are securely mounted. Stage 16, the reticle holder 17 mounted thereon, and the upper platform 3 of tower 2 are provided with clearance openings 6 permitting light passing through main reticle 12 to pass along the vertically extending optical path 34e through projection lens 18 to whatever object is positioned directly beneath the projection lens. The base 5 of tower 2 is mounted by air bearings on a casting 7, which is in turn fixedly mounted on a granite block 8 on which main stage 20 is mounted as described in U.S. patent application Ser. No. 015,713. Base 5 of tower 2 is vertically movable with respect to the casting 7 (hence, also the granite block 8) so as to permit vertical movement of the tower and, hence, projection lens 18 relative to main stage 20 under control of an automatic optical focusing system described in U.S. patent application Ser. No. 025,917. All of the elements of the dual channel objective lens unit 90 and of the binocular lens unit 93 are securely mounted on an upright portion 9 of casting 7, while the auxiliary reticle 23, the auxiliary light source unit 129 (see FIG. 1), and all of the elements of the auxiliary optical unit 31 are securely mounted on an upright portion 11 of the base 5 of tower 2 for vertical movement with the tower 2. In addition, all of the elements of controllable light source unit 24 (see FIG. 1) are mounted on an upright post (not shown) which is in turn rotatably mounted on casting 7 so as to permit the controllable light source unit to be pivoted away from the other portions of alignment and exposure system 10 for ease of service.

Figure 6:
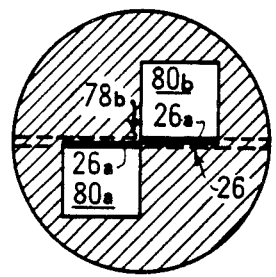
FIG. 6 is a top plan view of a portion of the reference mark when illuminated by a projected image of one of the reticle alignment marks contained on each main reticle.

Referring now to FIGS. 1, 3 and 6, the substage adjustment operation is performed by nominally aligning line 26a of reference mark 26 (and images of reticle alignment marks 78a and 78b contained on main reticle 12 that are projected downwardly along optical path 34e when those reticle alignment marks are illuminated) with respect to the X axis of motion of main stage 20; by employing controllable light source unit 24 to illuminate the reticle alignment marks 78a and 78b of the main reticle with exposure light for which projection lens 18 is corrected; by employing X and Y axes servo drive units 25 and 27 for moving the main stage to position reference mark plate 28 directly beneath the projection lens with the end portions (including tic marks 26b) of the reference mark illuminated by the projected images of the reticle alignment marks (i.e., by the exposure light passing through those reticle alignment marks); and by controlling dual channel objective lens unit 90 to position its objective lenses for viewing the aerial images of the illuminated end portions of the reference mark. Since prior to adjustment of substage 30, reference mark plate 28 is likely disposed adjacent to and intersecting, rather than in, the first image plane 77, these aerial images of the illuminated end portions of reference mark 26 will be out of focus (one end portion likely being disposed above and the other end portion below the first image plane). While viewing these out-of-focus aerial images, the operator manually adjusts substage 35 (employing adjustment screw 234 in FIG. 3) with respect to the plane of main stage 20, and the automatic focusing system described in U.S. patent application Ser. No. 025,917 automatically moves tower 2 (see FIG. 2) so as to track the average pivotal movement of the substage until both of these aerial images are brought into focus. At this point reference mark plate 28 is precisely positioned in and parallel to the first image plane 77, and the aerial images of the end portions of reference mark 26 illuminated by the projected images of reticle alignment marks 78a and 78b contained on main reticle 12 are in focus.

While employing one of the objective lenses of the dual channel objective lens unit 90 (for example, the right hand objective lens) to view one of the focused aerial images (for example, the aerial image of the end portion of reference mark 26 illuminated by the projected image of the right hand reticle alignment mark 78b), the operator employs the X axis servo drive unit 25 for moving main stage 20 back and forth along the X axis in a shuttle mode so as to alternately position each end portion of the reference mark in the projected image of the right hand reticle alignment mark 78b and thereby pass line 26a of the reference mark back and forth through that projected image as shown in FIG. 6. If line 26a of reference mark 26 is not precisely aligned with the X axis of motion of main stage 20, this back-and-forth movement of the main stage causes the illuminated portion of line 26a to rise and fall within the projected image of the right hand reticle alignment mark 78b. The operator thereupon adjusts the angular position of substage 35 (employing adjustment screw 244 in FIG. 3) until the illuminated portion of line 26a of reference mark 26 does not rise and fall within the projected image of the right hand reticle alignment mark (i.e., remains in the position shown in FIG. 6) as main stage 20 is moved back and forth. This precisely aligns line 26a of reference mark 26 with respect to the X axis of motion of main stage 20 and establishes the reference mark as an absolute frame of reference for precision alignment operations to be performed with alignment and exposure system 10 as hereinafter explained.

Either a special set-up main reticle or the first main reticle 12 to be employed with alignment and exposure system 10 may be employed to perform the substage adjustment operation. Moreover, the reference mark alignment portion of that operation may be performed in exactly the same manner as described in the preceding paragraph by employing auxiliary reticle 23 in place of main reticle 12 and by employing single channel auxiliary optical unit 31 in place of projection lens 18 and dual channel objective lens unit 90. In any case, once the substage adjustment operation (including the reference mark alignment portion thereof) has been completed, an auxiliary reticle setup operation may be performed. The manner in which this auxiliary reticle set-up operation is performed and the structure of auxiliary reticle 23, auxiliary light source unit 129, and single channel auxiliary optical unit 31 employed with reference mark 26 in this operation will now be described.

Figure 7:
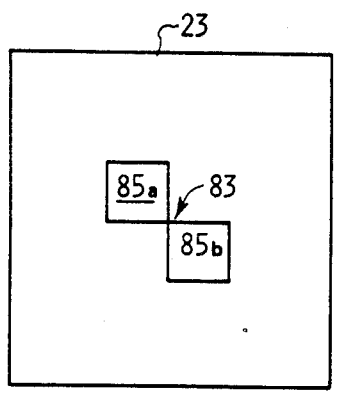
FIG. 7 is a top plan view of an auxiliary reticle employed with the single channel auxiliary optical unit of the step-and-repeat alignment and exposure system of FIGS. 1 and 2 and of a wafer alignment mark contained on that auxiliary reticle.

Referring to FIGS. 1, 2, and 7, auxiliary reticle 23 includes a wafer alignment mark 83, which, as best shown in FIG. 7, has a pair of transparent windows 85a and 85b arranged on an opaque field in the same manner as those of the reticle alignment mark 78a contained on each main reticle 12. Auxiliary reticle 23 is mounted along a vertically extending portion 143a of an optical path 143a–b on a holder 280 adapted for both pivotal movement about and translational movement relative to that portion of optical path 143a–b (as manually controlled by adjustment screws not shown) so as to permit alignment of a projected image of the wafer alignment mark 83 contained on the auxiliary reticle with respect to reference mark 26. A fiber optic light pipe 145 of auxiliary light source unit 129 is fixedly mounted at one end along the vertically extending portion 143a of optical path 143a–b directly above auxiliary reticle 23. The other end of fiber optic light pipe 145 is optically coupled to a light source 147 of auxiliary light source unit 129. Light source 147 directs white illuminating light (exclusive of any wavelengths of the exposure light) into fiber optic light pipe 145, which, in turn, directs that light downwardly along the vertically extending portion 143a of optical path 143a–b through auxiliary reticle 23.

Single channel auxiliary optical unit 31 includes a beam splitter 149 fixedly mounted along the vertically extending portion 143a of optical path 143a–b for transmitting fifty percent of the incident illuminating light from auxiliary reticle 23 downwardly along that portion of optical path 143a–b to main objective lens 33 of the single channel auxiliary optical unit. Main objective lens 33 is fixedly mounted along vertically extending portion 143a of optical path 143a–b for focusing the illuminating light passing through both auxiliary reticle 23 and beam splitter 149 at the first image plane 77 adjacent to main stage 20 and directly beneath that objective lens, thereby projecting an image of wafer alignment mark 83 contained on the auxiliary reticle onto whatever object is positioned in that image plane directly beneath that objective lens. Fifty percent of the illuminating light reflected vertically upward from that object (the reference mark plate 28 in the case of an auxiliary reticle set-up or checking operation or a semiconductive wafer 14 in the case of a wafer alignment operation) is reflected by beam splitter 149 along a horizontally extending portion 143b of optical path 143a–b to an image plane 157 positioned the same optical distance from that beam splitter as auxiliary reticle 123.

Single channel auxiliary optical unit 31 also includes a 5:1 objective lens 159 fixedly mounted along the horizontally extending portion 143b of optical path 143a–b for viewing image plane 157. The horizontally extending portion 143b of optical path 143a–b is axially aligned with the horizontally extending portion 87e of dual optical path 87a–f to permit use of single channel auxiliary optical unit 31 with the same binocular lens unit 93 as dual channel objective lens unit 90, depending on the position of slide 123. Accordingly, a positive lens 158 is fixedly mounted on slide 123 for movement into an operative position in those axially aligned horizontally extending portions 87e and 143b of dual optical path 87a–f and optical path 143a–f respectively, between beam bender 124 and objective lens 159 (as shown in FIG. 2) whenever auxiliary optical unit 31 is to be employed. With positive lens 158 so positioned, light from objective lens 159 passes through positive lens 158 and along portions 87e and 87f of dual optical path 87a–f to the image plane 127 directly in front of ocular lenses 126 of binocular head 94 as previously described.

The various elements of single channel auxiliary optical unit 31 are arranged along optical path 143a–b as described above so that main objective lens 33 focuses the light reflected from reference mark plate 28 or a semiconductive wafer 14 (depending on which is positioned in the first image plane 77 directly beneath that objective lens) at image plane 157. This provides in image plane 157 an aerial image of the portion of reference mark plate 28 or semiconductive wafer 14 illuminated by the projected image of the wafer alignment mark 83 contained on auxiliary reticle 23. Objective lens 159 has a focal length equal to the optical distance from its input pupil back along the horizontally extending portion 143b of optical path 143a–b to image plane 157. Concomitantly, positive lens 158 (when positioned in the operative position) has a focal length equal to the optical distance forward along portions 87e and 87f of dual optical path 87a–f to image plane 127 directly in front of ocular lenses 126 of binocular head 94. Objective lens 159 and positive lens 158 therefore reimage the aerial image provided in image plane 157 at image plane 127.

Figure 8:
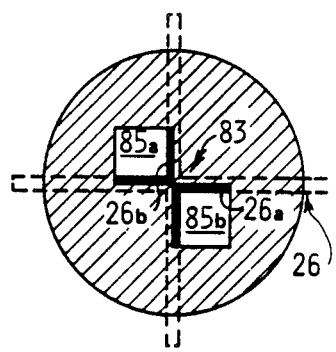
FIG. 8 is a top plan view of one end portion of the reference mark when that end portion is illuminated by a projected image of the wafer alignment mark contained on the auxiliary reticle of FIG. 7 and when that projected image is aligned with that end portion of the reference mark.

The auxiliary reticle set-up operation may be performed by initially nominally positioning auxiliary reticle 23 with respect to the vertically extending portion 143a of optical path 143a–b so that the projected image of wafer alignment mark 83 of the auxiliary reticle is nominally aligned with respect to the orthogonal X and Y axes of motion of main stage 20; by employing X and Y axes servo drive units 25 and 27 for moving the main stage to a position at which one end portion of reference mark 26 (disposed in the first image plane 77) is centered directly beneath main objective lens 33 (as shown in FIG. 2) so that end portion is illuminated by the projected image of the wafer alignment mark 83 of the auxiliary reticle; by employing slide 123 to move positive lens 158 into the operative position; by thereupon employing binocular lens unit 93 with single channel auxiliary optical unit 31 to view the aerial image of the illuminated end portion of the reference mark; and, while viewing that aerial image, by manually adjusting the auxiliary reticle to symmetrically position the projected image of the wafer alignment mark of the auxiliary reticle with respect to the illuminated end portion of the reference mark as shown in FIG. 8 (and, hence, in alignment with respect to the orthogonal X and Y axes of motion of the main stage). An image of auxiliary reticle 23 may then subsequently be employed to globally align any semiconductive wafer 14 with respect to the orthogonal X and Y axes of motion of main stage 20 and, hence, with respect to an image of any main reticle also aligned with respect to those axes of motion. Although either end portion of reference mark 26 may be employed during the auxiliary reticle set-up operation, the left hand end portion (as viewed in FIG. 1) shall be considered as the one employed herein. The auxiliary reticle set-up operation should not normally have to be repeated during the lifetime of alignment and exposure system 10. However, it may be checked at any time by simply employing reference mark 26 and single channel auxiliary optical unit 31 in the same manner as described above.

A set of n different main reticles 12, each containing a different level of microcircuitry to be successively printed at each of an array of adjacent regions 162 of semiconductive wafer 14 in alignment with other levels of microcircuitry previously printed or yet to be printed at those same regions, is employed in the fabrication of integrated circuits or the like from the semiconductive wafer. Following the substage adjustment operation and the auxiliary reticle set-up operation, alignment and exposure system 10 may be successively employed with each main reticle 12 of the set to successively perform each of these step-and-repeat printing operations on every semiconductive wafer 14 of a batch of semiconductive wafers being processed by the alignment and exposure system, as described below.

Figure 9:
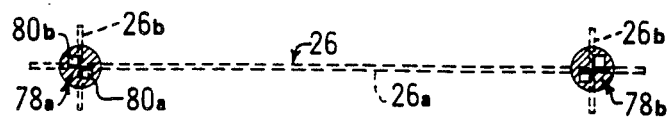
FIG. 9 is a top plan view of the end portions of the reference mark when those end portions are illuminated by projected images of a pair of reticle alignment marks contained on each main reticle and when those projected images are aligned with those end portions of the reference mark.

During each step-and-repeat printing operation, an image of the main reticle 12 being employed must first be precisely aligned with respect to reference mark 26 of substage 35 and, hence, with respect to the orthogonal X and Y axes of motion of main stage 20. With reference now particularly to FIGS. 1 and 9, this is accomplished by placing main reticle 12 on vacuum holder 17 of stage 16 and positioning the main reticle with respect to optical path 34e so that images of the reticle alignment marks 78a and 78b contained on the main reticle and projected downwardly along that optical path when those reticle alignment marks are illuminated are nominally aligned with respect to the orthogonal X and Y axes of motion of main stage 20; by employing X and Y axis servo drive units 25 and 27 for moving the main stage to a position at which the reference mark 26 (disposed in the first image plane 77) is centered directly beneath projection lens 18 with the end portions of the reference mark nominally aligned with the images of the reticle alignment marks 78a and 78b to be projected onto reference mark plate 28 when those reticle alignment marks are illuminated; by employing controllable light source unit 24 to illuminate the reticle alignment marks 78a and 78b with exposure light (thereby illuminating the end portions of the reference mark); by employing slide 123 for moving beam bender 122 into the operative position; by controlling dual channel objective lens unit 90 to position its objective lenses for viewing the aerial images of the end portions of reference mark 26 illuminated by the projected images of the reticle alignment marks 78a and 78b; and, while viewing those aerial images, by employing the X axis and differential Y axis servo drive units 84, 86a, and 86b for moving stage 16 and, hence, the main reticle to precisely align the projected images of the reticle alignment marks 78a and 78b with respect to the illuminated end portions of reference mark 26 as shown in FIG. 9. When so aligned the images of transparent windows 80a and 80b of each reticle alignment mark 78a and 78b are symmetrically disposed with respect to the line 26a and intersecting tic mark 26b of the respective end portion of reference mark 26 (and, hence, with respect to the orthogonal axes of motion of the main stage and with respect to auxiliary reticle 23). It should be noted that many of the foregoing steps of the main reticle alignment operation will already have been performed in the case of the first main reticle of the first set of main reticles being employed with alignment and exposure system 10 if that main reticle is initially employed, rather than a special set-up reticle, in performing the previously described substage adjustment operation.

The X and Y coordinates of the position of main stage 20 where reference mark 26 is centered directly beneath projection lens 18 and where the projected images of reticle alignment marks 78a and 78b of the first main reticle 12 employed with alignment and exposure system 10 are precisely aligned with respect to the illuminated end portions of reference mark 26 (hereinafter referred to as the original main reticle alignment position) are stored in a computer employed with X and Y axes servo drive units 25 and 27. These X and Y coordinates are determined with reference to a home position of main stage 20 and represent the distances the main stage must be moved along the orthogonal X and Y axes, respectively, of the system in going from the home position to the original main reticle alignment position. Every time a main reticle alignment operation is to be performed by alignment and exposure system 10 those X and Y coordinates are supplied by the computer to X and Y axes servo drive units 25 and 27 so that main stage 20 is moved to the same original main reticle alignment position.

The X and Y coordinates of the position where the left hand end portion of reference mark 26 is centered directly beneath main objective lens 33 of single channel auxiliary optical unit 31 and where the projected image of wafer alignment mark 83 of auxiliary reticle 23 is precisely aligned with respect to that end portion (hereinafter referred to as the original auxiliary reticle set-up position) are also stored in the computer. These X and Y coordinates are similarly determined with respect to the home position of main stage 20 and therefore represent the distances the main stage must be moved along the orthogonal X and Y axes, respectively, of the system in going from the home position to the auxiliary reticle set-up position. Any time an auxiliary reticle set-up checking operation is to be performed by alignment and exposure system 10 those X and Y coordinates are supplied by the computer to X and Y axes servo drive units 25 and 27 so that main stage 20 is moved to the same original auxiliary reticle set-up position.

The coordinate difference between the X and Y coordinates of the original auxiliary reticle set-up position and those of the original main reticle alignment position therefore represent the original relative spacing between an image of auxiliary reticle 23 and an image of main reticle 12. Since reference mark 26 is employed both with main objective lens 33 of single channel auxiliary optical unit 35 in performing the auxiliary reticle set-up operation and with projection lens 18 in performing the main reticle alignment operation, the reference mark may be employed from time to time to check for changes in the original relative spacing between the images of auxiliary reticle 23 and main reticle 12 due to environmental changes and, if necessary, to reconcile alignment and exposure system 10 with respect to any such environment changes. This may be done by employing X and Y axes servo drive units 25 and 27 for moving main stage 20 from its home position to the original auxiliary reticle set-up position; by employing single channel auxiliary optical unit 31 with binocular lens unit 93 to check the alignment of the projected image of wafer alignment mark 83 of auxiliary reticle 23 with respect to the left hand end portion of reference mark 26 at the original auxiliary reticle set-up position and, if any misalignment is detected, employing the X and Y axes servo drive units for moving the main stage to a new auxiliary reticle set-up position at which the misalignment is eliminated; and by storing the X and Y coordinates of the new auxiliary reticle set-up position in the computer. These steps are then performed with respect to the image of main reticle 12 by employing X and Y axes servo drive units 25 and 27 for moving main stage 20 to the original main reticle alignment position; by employing controllable light source unit 24 to illuminate the reticle alignment marks 78a and 78b of main reticle 12 with exposure light; by employing projection lens 18 with dual channel objective lens unit 90 and binocular lens unit 93 to check the alignment of the projected images of the reticle alignment marks of the main reticle with respect to the right and left hand end portions of reference mark 26 at the original main reticle alignment position and, if any misalignment is detected, employing the X and Y axes servo drive units for moving the main stage to a new main reticle alignment position at which the misalignment is eliminated; and by storing the X and Y coordinates of the new main reticle alignment position in the computer. The coordinate difference between the X and Y coordinates of the new auxiliary reticle set-up position and those of the new main reticle alignment position therefore represents the new (or updated) relative spacing between the image of auxiliary reticle 23 and the image of main reticle 12. This coordinate difference is thereafter employed by the computer in determining any further positioning of main stage 20 with respect to single channel auxiliary optical unit 31 (such as following any alignment operation performed with the single channel auxiliary optical unit) until such time as the relative spacing between the images of auxiliary reticle 23 and main reticle 12 is again checked, found to have changed due to environmental changes, and updated. In this manner, alignment and exposure system 10 is reconciled with respect to such environmental changes.

As shown in FIGS. 1 and 2, main stage 20 is provided with a detector unit 250 in order to establish its home position where the X and Y coordinates are both zero and where an automatic wafer handling system is employed to automatically sequentially load semiconductive wafers 14 onto vacuum chuck 131 for processing by alignment and exposure system 10 and to automatically remove each semiconductive wafer once it has been so processed. Detector unit 250 comprises a photodiode 252 for differentially detecting light in four quadrants, a light source 254 for uniformily illuminating the photodiode, and a home position locator plate 256 for passing between the photodiode and the light source when main stage 20 is in the vicinity of its home position. Photodiode 252 is mounted on the granite block 8 supporting main stage 20 and is disposed on one side of home position locator plate 256 so that the four light detection quadrants of the photodiode are positioned in a plane parallel to the home position locator plate and are symmetrically disposed with respect to the X and Y axes of motion of the main stage. Light source 254 is also mounted on granite block 8 and is disposed on the other side of home position locator plate 256 directly above and in coaxial alignment with photodiode 252. Home position locator plate 256 is mounted on the bottom of main stage 20 so as to extend forwardly therefrom and is provided with an opening 258 that is smaller in size than (e.g., about half as large as) the total surface area of the four light detection quadrants of photodiode 252 and that is coaxially aligned with the photodiode and light source 254 when the main stage is precisely located at the home position so as to null the photodiode. Photodiode 252 is activated by the computer employed with X and Y axes servo drive units 25 and 27 whenever main stage 20 is nominally located at its home position. Once photodiode 252 is activated, it supplies X and Y axes servo drive units 25 and 27 with differential X and Y axes position error signals via leads 260 until main stage 20 is precisely located at its home position where, if necessary, the X and Y coordinates are reset to zero.

Once the substage adjustment and auxiliary reticle set-up operations have been completed and the image of the first main reticle 12 of the set of main reticles being employed with alignment and exposure system 10 has been aligned with respect to reference mark 26, as previously described, a pair of spaced global wafer alignment marks 130a and 130b contained on the first main reticle is printed on each semiconductive wafer 14 of the batch of semiconductive wafers being processed by the alignment and exposure system. The global wafer alignment marks 130a and 130b printed on each semiconductive wafer 14 of the batch are employed to globally align the semiconductive wafer, as hereinafter explained, in preparation for each step-and-repeat printing operation. The same pair of global wafer alignment marks 130a and 130b can be employed in preparation for every step-and-repeat printing operation to be performed on a semiconductive wafer 14 so long as that pair of global wafer alignment marks does not become obliterated or obscured during those step-and-repeat printing operations or other processing operations following each step-and repeat printing operation. Additional pairs of global wafer alignment marks 130a and 130b may also be contained on the first main reticle 12 of the set and printed on each semiconductive wafer 14 of the batch during the same global wafer alignment mark printing operation in the event they should later be required.

Figure 10:
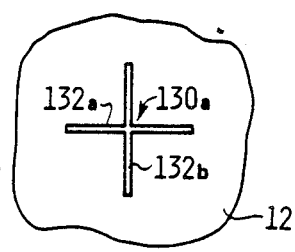
FIG. 10 is a top plan view of one of a pair of global wafer alignment marks contained on a first main reticle of a set of main reticles employed with the step-and-repeat alignment and exposure system of FIGS. 1 and 2.
Figure 11A:
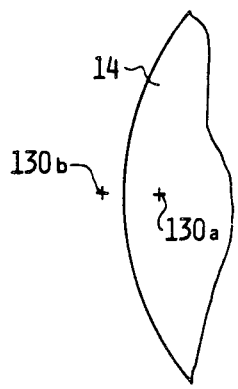
FIGS. 11A and 11B are top plan views illustrating how a pair of global wafer alignment marks may be printed on a semiconductive wafer being processed by the step-and-repeat alignment and exposure system of FIGS. 1 and 2.
Figure 11B:
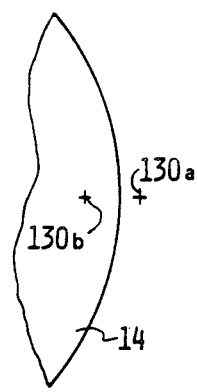

The global wafer alignment marks 130a and 130b contained on the first main reticle 12 of the set are disposed directly adjacent to and behind reticle alignment marks 78a and 78b (and are correspondingly spaced 103 millimeters apart). As best shown in FIG. 10 each of these global wafer alignment marks 130a and 130b comprises a light or transparent cross (with orthogonal bars 132a and 132b) disposed on a dark or opaque field. In preparation for printing these global wafer alignment marks 130a and 130b on each semiconductive wafer 14 of the batch as indicated in FIGS. 11A and 11B, a photosensitive film is deposited over each semiconductive wafer. The global wafer alignment mark printing operation is then successively performed on each semiconductive wafer 14 of the batch in the same manner as will now be described for the first semiconductive wafer with particular reference to FIGS. 1, 2, 11A and 11B.

Figure 12:
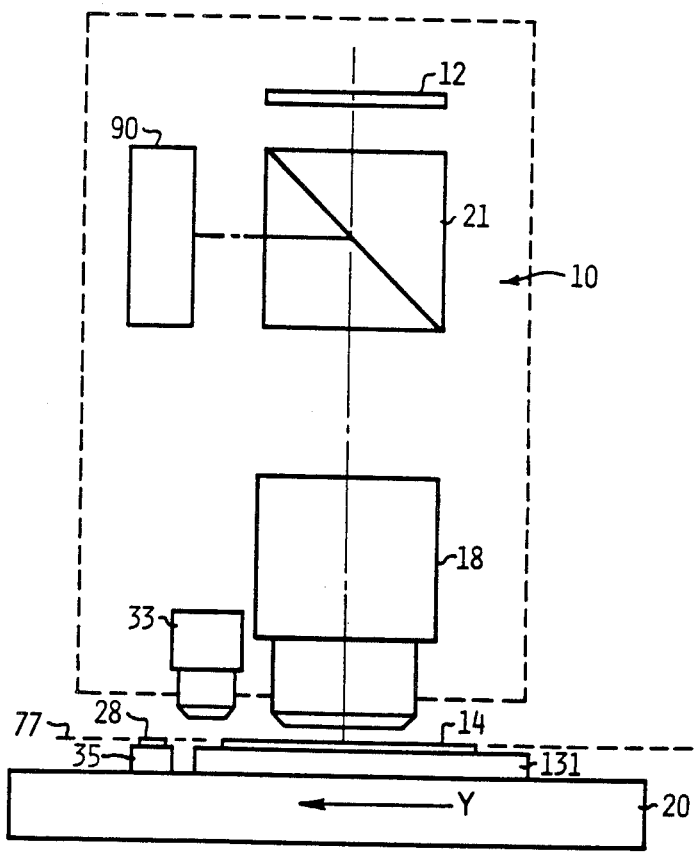
FIG. 12 is a schematic representation of a portion of the step-and-repeat alignment and exposure system of FIGS. 1 and 2 showing a semiconductive wafer positioned directly beneath the projection lens during a global wafer alignment mark printing operation, a global or precision region-by-region alignment operation (performed with the projection lens), or a step-and-repeat printing operation.

The first semiconductive wafer 14 is loaded onto vacuum chuck 131, which is mounted on main stage 20 for differential movement with respect to the plane of the main stage to permit parallel-plane alignment and focusing of the upper surface of the semiconductive wafer in the first image plane 77 as described in detail in U.S. patent application Ser. No. 025,917. The left hand global wafer alignment mark 130a contained on the first main reticle 12 of the set is printed on the left hand side of the first semiconductive wafer 14 by employing X and Y axes servo drive units 25 and 27 for moving main stage 20 to a position at which the left hand side of the semiconductive wafer is disposed directly beneath projection lens 18 (as generally indicated in FIG. 12) so that, when the left and right hand global wafer alignment marks 130a and 130b contained on the main reticle are illuminated by controllable light source unit 24, the left hand global wafer alignment mark 130a will be imaged onto the left hand side of the semiconductive wafer at a left marginal location along a centerline 134 parallel to the X axis of motion of the main stage, while the right hand global wafer alignment mark 130b will be imaged off and to the left of the semiconductive wafer, as shown in FIG. 11A; and by thereupon employing controllable light source unit 24 for momentarily illuminating the left and right hand global wafer alignment marks 130a and 130b contained on the main reticle with exposure light so as to selectively expose the photosensitive film deposited on the semiconductive wafer in accordance with the left hand global wafer alignment mark 130a and thereby print that left-hand global wafer alignment mark on the semiconductive wafer at the aforementioned left marginal location. Similarly, the right hand global wafer alignment mark 130b contained on the first main reticle 12 of the set is then printed on the right hand side of the first semiconductive wafer 14 by employing X and Y axes servo drive units 25 and 27 for moving main stage 20 to a position at which the right hand side of the semiconductive wafer is disposed directly beneath projection lens 18 so that when the left and right hand global wafer alignment marks 130a and 130b contained on the main reticle are again illuminated by controllable light source unit 24, the right hand global wafer alignment mark 130b will be imaged onto the right hand side of the semiconductive wafer at a right marginal location along the centerline 134, while the left hand global wafer alignment mark 130a will be imaged off and to the right of the semiconductive wafer, as shown in FIG. 11B; and by thereupon employing controllable light source unit 24 for momentarily illuminating the left and right hand global wafer alignment marks 130a and 130b contained on the main reticle with exposure light so as to selectively expose the photosensitive film deposited on the semiconductive wafer in accordance with the right hand global wafer alignment mark 130b and thereby print that right hand global wafer alignment mark on the semiconductive wafer at the aforementioned right marginal location.

Following the foregoing global wafer alignment mark printing operation, it may be necessary to remove the first semiconductive wafer 14 from alignment and exposure system 10, such as in cases where different processing is required for the printed global wafer alignment marks 130a and 130b than for the first level of microcircuitry (and smaller precision wafer alignment marks) contained on the first main reticle 12 and yet to be printed on the semiconductive wafer. In such cases, the first semiconductive wafer 14 is then removed from alignment and exposure system 10 and the same global wafer alignment mark printing operation repeated for each of the remaining semiconductive wafers of the batch. All of the semiconductive wafers 14 of the batch are subsequently processed in accordance with well known techniques to develop the selectively exposed photosensitive film on each semiconductive wafer and, for example, to etch the printed global wafer alignment marks 130a and 130b into each semiconductive wafer to a deeper level than required for the first level of microcircuitry (and smaller precision wafer alignment marks) yet to be printed on each semiconductive wafer. After completion of this processing, every semiconductive wafer 14 of the batch is again covered with a photosensitive film and each is then successively placed back in alignment and exposure system 10 and globally aligned with respect to the orthogonal X and Y axes of motion of main stage 20 and, hence, with respect to the image of the first main reticle 12 of the set in preparation for step-and-repeat printing of the first level of microcircuitry (and precision wafer alignment marks) contained on the first main reticle.

The global alignment operation may be performed with the greatest precision by employing the main reticle 12 and the projection lens 18 with the dual channel objective lens unit 90 and the binocular lens unit 93. However, in some cases, the projection lens 18 may not be so employed due to interference patterns that may exist on the upper surface of a semiconductive wafer 14 in the first image plane 77 at the wavelength of the exposure light for which the projection lens is corrected or at the wavelength of the illuminating light for which it may be compensated. In such cases the global alignment operation may be performed by employing the auxiliary reticle 23 and the single channel auxiliary optical unit 31 with the binocular lens unit 93. Since the global alignment operation may be performed in basically the same manner on every semiconductive wafer 14 of the batch with the main reticle 12 and the projection lens 18 or with the auxiliary reticle 23 and the single channel auxiliary optical unit 31, it will now be described in detail only as performed on the first semiconductive wafer of the batch with the auxiliary reticle and the single channel auxiliary optical unit.

Figure 13:
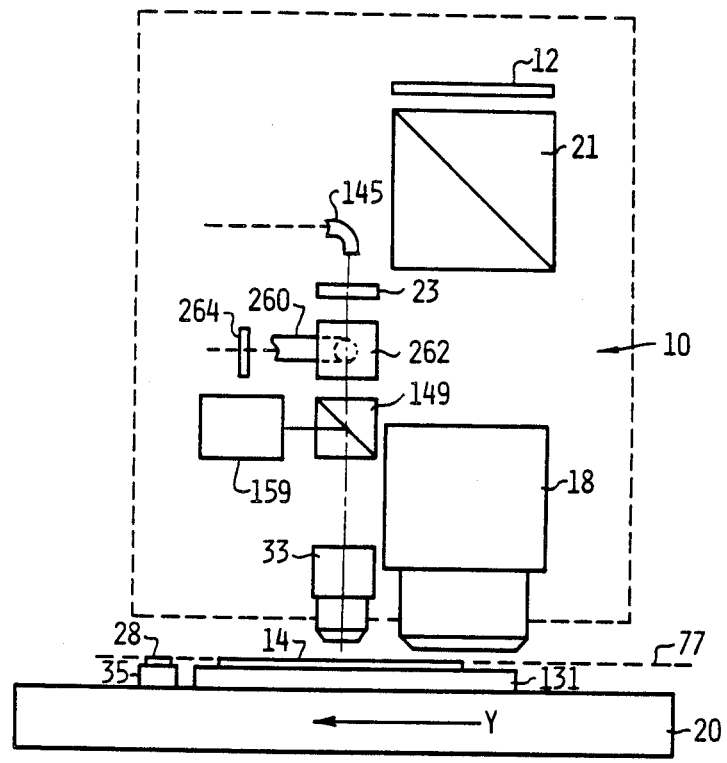
FIG. 13 is another schematic representation of a portion of the step-and-repeat alignment and exposure system of FIGS. 1 and 2 showing a semiconductive wafer positioned directly beneath the main objective lens of the single channel auxiliary optical unit during a global or precision region-by-region alignment operation performed with the single channel auxiliary optical unit.
Figures 14A, 14B, 14C:
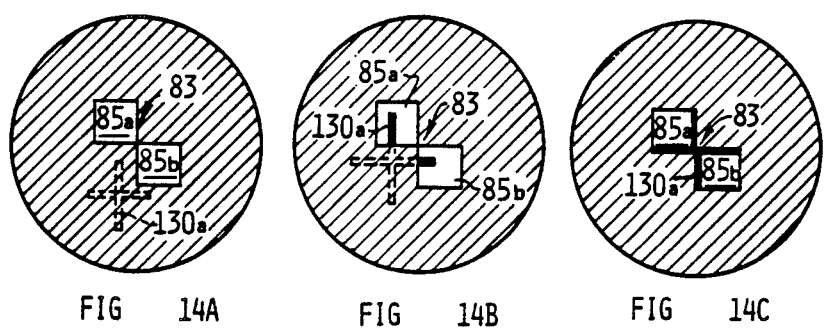
FIGS. 14A, 14B, and 14C are top plan views illustrating a global wafer alignment mark printed on a semiconductive wafer and to be globally aligned with respect to a projected image of the wafer alignment mark contained on the auxiliary reticle when the global wafer alignment mark printed on the semiconductive wafer is positioned completely out of that projected image (i.e., is marked by the auxiliary reticle), is positioned within that projected image, and is properly aligned with respect to that projected image, respectively.

With reference particularly to FIGS. 1, 2, 13, 14A, 14B and 14C, the global alignment operation is performed by loading the first semiconductive wafer 14 onto vacuum chuck 131 with the global wafer alignment marks 130a and 130b of the semiconductive wafer in nominal alignment with respect to the orthogonal X and Y axes of motion of main stage 20 and with the upper surface of the semiconductive wafer disposed in the first image plane 77; by employing slide 123 to position positive lens 158 in the operative position; and by employing X and Y axes servo drive units 25 and 27 for moving main stage 20 to alternately position the left and right hand global wafer alignment marks 130a and 130b of the semiconductive wafer directly beneath main objective lens 33 of single channel auxiliary optical unit 31 (as generally indicated in FIG. 13) so as to allow X and Y axes and $\theta$ rotational alignments of those global wafer alignment marks with respect to the projected image of wafer alignment mark 83 of the auxiliary reticle. Initially, an X and Y axes alignment may be performed by employing X and Y axes servo drive units 25 and 27 for moving main stage 20 to position the left hand global wafer alignment mark 130a of semiconductive wafer 14 directly beneath main objective lens 33; and by employing single channel auxiliary optical unit 31 with binocular lens unit 93 to view an aerial image of portions of the left hand global alignment mark 130a illuminated by the projected image of wafer alignment mark 83 of auxiliary reticle 23. However, the left hand global wafer alignment mark 130a of semiconductive wafer 14 may not be initially illuminated by the projected image of wafer alignment mark 83 of auxiliary reticle 23, and may not be so easily located, since it may be masked by the opaque field of the auxiliary reticle as shown in FIG. 14A. In this situation, the entire field of view of main objective lens 33 of single channel auxiliary optical unit 31 may be selectively frontally illuminated by white illuminating light not passing through auxiliary reticle 23 in order to facilitate locating the left hand global wafer alignment mark 130a of semiconductive wafer 14.

As best shown in FIG. 1, the frontal illumination for main objective lens 33 of single channel auxiliary optical unit 31 is provided by auxiliary light source unit 129, which includes a fiber optic light pipe 260 coupled at one end to light source 147 and fixedly mounted at the other end for directing white illuminating light from the light source to a beam splitter 262 of the single channel auxiliary optical unit (the output ends of fiber optic light pipes 145 and 260 being spaced the same optical distance from beam splitter 262). Auxiliary light source unit 129 further includes a shutter 264 normally closed for blocking the passage of white illuminating light from light source 147 along fiber optic light pipe 260 to beam splitter 262 (as indicated in solid lines in FIG. 1), and selectively opened for permitting the passage of white illuminating light from that light source along that fiber optic light pipe to that beam splitter (as indicated in dashed lines in FIG. 1) under the control of a $\theta$ servo drive unit 266. Beam splitter 262 is fixedly mounted along portion 143a of optical path 143a-b directly between auxiliary reticle 23 and beam splitter 149 so as to reflect fifty percent of the white illuminating light from fiber optic light pipe 260 downwardly along that portion of that optical path towards beam splitter 149 and main objective lens 33 (and also so as to pass fifty percent of the white illuminating light passing through auxiliary reticle 23 downwardly along that portion of that optical path towards beam splitter 149 and main objective lens 33 as previously described). Thus, by employing $\theta$ servo drive unit 266 to open shutter 264, the entire field of view of main objective lens 33 may be illuminated to faciliate locating the left hand global wafer alignment mark 130a (or any other alignment mark employed in any other alignment operation involving single channel auxiliary optical unit 31) when it would otherwise be masked by the opaque field of auxiliary reticle 23 as shown in FIG. 14A.

Once the left hand global wafer alignment mark 130a of semiconductive wafer 14 has been located, X and Y axes servo drive units 25 and 27 may be employed for moving main stage 20 to reposition that global wafer alignment mark at least partially within the projected image of wafer alignment mark 83 of auxiliary reticle 23 as shown in FIG. 14B. The $\theta$ servo drive unit 266 is then employed to close shutter 264 so as to remove the frontal illumination from main objective lens 33 of single channel auxiliary optical unit 31. While employing single channel auxiliary optical unit 31 with binocular lens unit 93 to view the aerial image of the portions of the left hand global wafer alignment mark 130a thereupon illuminated by the projected image of wafer alignment mark 83 of auxiliary reticle 23, X and Y axes servo drive units 25 and 27 are employed for moving main stage 20 to align the left hand global wafer alignment mark 130a symmetrically with respect to that projected image as shown in FIG. 14C. The X and Y coordinates of the position of main stage 20 at which this alignment of the left hand global wafer alignment mark 130a is achieved are stored in the computer employed with X and Y axes servo drive units 25 and 27.

Another X and Y axes alignment is then performed by employing X axis servo drive unit 25 for moving main stage 20 to the left along the X axis a distance equal to the spacing between the left and right hand global wafer alignment marks 130a and 130b so as to position the right hand global wafer alignment mark 130b directly beneath the projected image of wafer alignment mark 83 of auxiliary reticle 23; by employing single channel auxiliary optical unit 31 with binocular lens unit 93 to view an aerial image of portions of the right hand global wafer alignment mark 130b illuminated by the projected image of wafer alignment mark 83 of the auxiliary reticle; and, while viewing that aerial image, by employing Y axis servo drive unit 27 and, if necessary, also the X axis servo drive unit for moving the main stage to align the right hand global wafer alignment mark 130b symmetrically with respect to the projected image of wafer alignment mark 83 of the auxiliary reticle in the same manner as shown in FIG. 14C for the left hand global wafer alignment mark 130a. The X and Y coordinates of the position of main stage 20 at which this alignment of the right hand global wafer alignment mark 130b is achieved and the difference, if any, between the X coordinates of the initial and final positions of the main stage during this same alignment are also stored in the computer employed with X and Y axes servo drive units 25 and 27.

The computer is thereupon employed to calculate a $\theta$ alignment correction equal to the arctangent of the quotient of the difference between the Y coordinates of the positions of main stage 20 at which the alignments of the left and right hand global wafer alignment marks 130a and 130b are achieved divided by the difference between the X coordinates of those same positions of the main stage. This $\theta$ alignment correction is supplied by the computer to a $\theta$ servo drive unit 29 for rotating vacuum chuck 131 on main stage 20 to move both global wafer alignment marks 130a and 130b of the first semiconductive wafer 14 into $\theta$ rotational alignment with respect to the orthogonal X and Y axes of motion of the main stage. The computer is also employed to calculate any X coordinate correction (equal to the quotient of the difference, if any, stored once the alignment of the right hand global wafer alignment mark 130b has been achieved divided by two) and an average Y coordinate (equal to the quotient of the sum of the Y coordinates of the positions of main stage 20 at which the alignments of the left and right hand global wafer aliqnment marks 130a and 130b are achieved divided by two). This average Y coordinate and any X coordinate correction (together with the coordinate difference representing the relative spacing between the images of the auxiliary reticle 23 and the first main reticle 12) are thereafter employed by the computer in determining the further positioning of main stage 20 while the first semiconductive wafer 14 is being processed by alignment and exposure system 10. Once the foregoing X and Y axes and θ rotational alignments have been completed, the first semiconductive wafer 14 of the batch is globally aligned with respect to the orthogonal X and Y axes of motion of main stage 20, and, hence, with respect to the projected images of reticle alignment marks 78a and 78b of the first main reticle 12 of the set.

As mentioned above, the foregoing global alignment operation can be performed with greater precision (when not precluded from doing so because of interference patterns or the like) by employing controllable light source unit 24 to illuminate the reticle alignment marks 78a and 78b of the first (or any succeeding) main reticle 12 of the set so that, for example, the projected image of the left hand reticle alignment mark 78a can be utilized in the operation; and by employing slide 123 for moving beam bender 122 into the operative position so that projection lens 18 can be utilized with, for example, the left hand objective lens of dual channel objective lens unit 90 and with binocular lens unit 93 in viewing portions of the semiconductive wafer illuminated by the projected image of the left hand reticle alignment mark 78a. The global alignment of the first (or any succeeding) semiconductive wafer 14 of the batch may then be performed in the same manner as described above by employing X and Y axes servo drive units 25 and 27 for moving main stage 20 to initially align the left hand global wafer alignment mark 130a and then the right hand global wafer alignment mark 130b of that semiconductive wafer symmetrically with respect to the projected image of the left hand reticle alignment mark 78a; by employing the computer employed with the X and Y axes servo drive units to compute the θ alignment correction, average Y coordinate, and any X coordinate correction for that semiconductive wafer; by employing θ servo drive unit 29 for rotating vacuum chuck 131 to move the global wafer alignment marks 130a and 130b into θ rotational alignment with respect to the orthogonal X and Y axes of motion of the main stage and, hence, with respect to the projected images of the left and right hand reticle alignment marks 78a and 78b; and by employing the computer to determine the further positioning of the main stage for that semiconductive wafer in accordance with the average Y coordinate and any X coordinate correction. If needed, the frontal illumination system mentioned above in connection with U.S. patent application Ser. No. 113,375 and employed with dual channel objective lens unit 90 or binocular lens unit 93 may also be utilized to facilitate initially locating the left hand global wafer alignment mark 130a for any other alignment mark employed in any other alignment operation involving projection lens 18).

Figure 15:
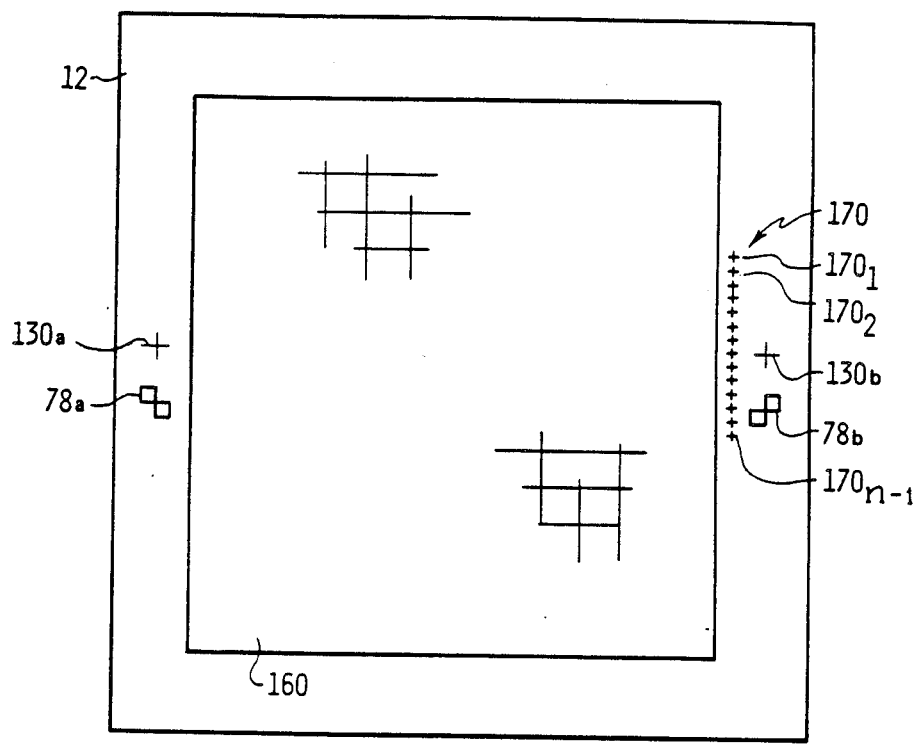
FIG. 15 is a top plan view of a portion of a first main reticle of a set of main reticles employed with the step-and-repeat alignment and exposure system of FIGS. 1 and 2 and also of precision wafer alignment marks contained on that first main reticle.

Following the global alignment operation, a step-and-repeat printing operation is performed to photometrically print the first level of microcircuitry contained on a square central region 160 of the first main reticle 12 at each of the desired array of adjacent regions 162 of the first semiconductive wafer 14 as hereinafter described. In order to permit each remaining level of microcircuitry to be successively printed at each of the same desired array of adjacent regions 162 of the first semiconductive wafer 14 in precision alignment with the level or levels of microcircuitry previously printed at each of those same regions, small precision wafer alignment marks are also printed alongside each of those same regions during the same step-and-repeat printing operation performed to print the first level of microcircuitry. As shown in FIG. 15, the first main reticle 12 of the set is therefore provided with a set of precision wafer alignment marks 170, which may be vertically arranged in a column in the marginal portion of the first main reticle along the Y axis of motion of main stage 20 and between one side of the microcircuitry containing central portion 160 of the first main reticle and the right hand reticle alignment and global wafer alignment marks 78b and 130b of the first main reticle. These precision wafer alignment marks 170 may comprise crosses of the same type as the global wafer alignment marks 130a and 130b (i.e., light or transparent lines oriented parallel to those of the global wafer alignment marks and disposed on a dark or opaque field), but are substantially smaller and are equal in number to the n−1 remaining main reticles of the set. The set of precision wafer alignment marks 170 (but not the reticle alignment marks 78a and 78b or the global wafer alignment marks 130a and 130b) and the square, central, microcircuitry-containing region 160 of the first main reticle 12 lie within the central are a of the first main reticle that may be selectively illuminated with exposure light by controllable light source unit 24. Thus, the photosensitive film deposited on the first semiconductive wafer 14 may be selectively exposed so as to simultaneously print the first level of microcircuitry at, and the set of precision wafer alignment marks 170 alongside, each of the desired array of adjacent regions 162 of the first semiconductive wafer during the initial step-and-repeat printing operation.

Once the initial step-and-repeat printing operation has been performed, the first semiconductive wafer 14 is removed from alignment and exposure system 10, and the global alignment and initial step-and-repeat printing operations are repeated for each of the remaining semiconductive wafers of the batch. All of the semiconductive wafers 14 of the batch are subsequently processed to develop the selectively exposed photosensitive film on each semiconductive wafer and to selectively etch, diffuse, plate, implant or otherwise process the semiconductive wafers in accordance with well known techniques for forming the first level of microcircuitry on each semiconductive wafer at each of the desired array of adjacent regions 162. At this point it should be noted that in cases where the global wafer alignment marks 130a and 130b do not require different processing (such as deeper etching) than the precision wafer alignment marks 170 and the first level of microcircuitry, the initial step-and-repeat printing operation may be performed on each semiconductive wafer 14 of the batch immediately after the global wafer alignment mark printing operation without removing the semiconductive wafer from alignment and exposure system 10 and, hence, without the need for performing the global alignment operation prior to the initial step-and-repeat printing operation.

Figure 16:
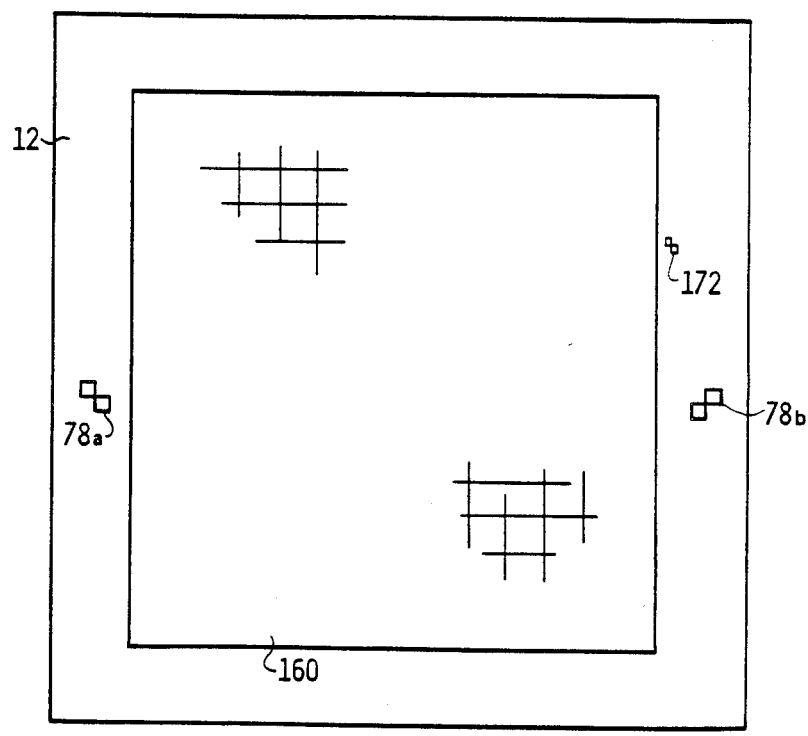
FIG. 16 is a top plan view of a portion of a second main reticle of a set of main reticles employed with the step-and-repeat alignment and exposure system of FIGS. 1 and 2 and also of a precision wafer alignment mark contained on that second main reticle.

Following the initial step-and-repeat printing and subsequent processing operations, the first main reticle 12 is removed from alignment and exposure system 10. The second main reticle 12 of the set is then placed on vacuum holder 17 of stage 16 in nominal alignment with the orthogonal X and Y axes of motion of main stage 20 and is thereupon precisely aligned with those axes of motion in exactly the same manner as previously described. As shown in FIG. 16, the second main reticle 12 is provided with a small precision wafer alignment mark 172 in the marginal portion thereof along the Y axis of motion of main stage 20 between the right hand reticle alignment mark 78b and one side of the central microcircuitry-containing region 160. This precision wafer alignment mark 172 may comprise a pair of square windows of the same type as those of the left hand reticle alignment mark 78a (i.e., a pair of light or transparent windows symmetrically oriented about the center of the precision wafer alignment mark on opposite sides of a pair of orthogonal centerlines thereof and disposed on a dark or opaque field), but is substantially smaller than the reticle alignment mark (being of about the same size as one of the precision wafer alignment marks 170 contained on the first main reticle 12). The precision wafer alignment mark 172 is disposed at the same position on the second main reticle 12 as a corresponding first one of the set of n−1 precision wafer alignment marks 170 contained on the first main reticle and may therefore be illuminated (independently of the central microcircuitry-containing region 160 of the second main reticle) by employing controllable light source unit 24 to do so. An identical precision wafer alignment mark 172 is also provided in the same manner on each of the succeeding main reticles 12 of the set, but at the same position as the corresponding succeeding one of the set of n−1 precision wafer alignment marks 170 contained on the first main reticle. Thus, the first through the last precision wafer alignment marks 172 provided on the second through the nth main reticles 12 of the set of n reticles correspond to the first through the last precision wafer alignment marks $170_1$-$170_{n-1}$, respectively, of the set of n−1 precision wafer alignment marks 170 printed and formed alongside and therefore associated with each of the plurality of adjacent regions 162 of each semiconductive wafer during the initial step-and-repeat printing operation (the subscripts 1 through n−1 hereinafter being used when referring specifically to the first through the last precision wafer alignment marks 170 formed on the semiconductive wafer).

Also following the initial step-and-repeat printing and subsequent processing operations, a photosensitive film is again deposited over each semiconductive wafer 14 of the batch in preparation for further processing of each semiconductive wafer by alignment and exposure system 10 with the second main reticle 12. In turn, each semiconductive wafer 14 is thereafter placed back in alignment and exposure system 10 as described above, globally aligned as described above, and then precision region-by-region aligned with the aid of the first precision wafer alignment mark $170_1$ associated with and alongside selected ones of the array of adjacent regions 162 of the semiconductive wafer. This precision region-by-region alignment operation may be performed with the greatest precision by employing the second main reticle 12 and by employing the projection lens 18 with the dual channel objective lens unit 90 and the binocular lens unit 93 to view an aerial image of the first precision wafer alignment mark $170_1$ associated with each selected region 162 of the semiconductive wafer 14 when that precision wafer alignment mark is illuminated by the projected image of the corresponding precision wafer alignment mark 172 of the second main reticle. However, in some cases (depending on the processing employed during formation of the preceding level of microcircuitry on the semiconductive wafer 14) it may not be possible to employ the projection lens 18 due to interference patterns or the like as previously explained. In such cases, the precision region-by-region alignment operation may be performed by employing the auxiliary reticle 23 and by moving slide 123 to locate positive lens 158 in the operative position so that single channel auxiliary optical unit 31 may be employed with binocular lens unit 93 to view an aerial image of the first precision wafer alignment mark $170_1$ associated with each selected region 162 of the semiconductive wafer 14 when that precision wafer alignment mark is illuminated by the projected image of the wafer alignment mark 83 of the auxiliary reticle. The manner in which the precision region-by-region alignment operation is so performed on the first semiconductive wafer 14 of the batch will now be described.

Figure 17:
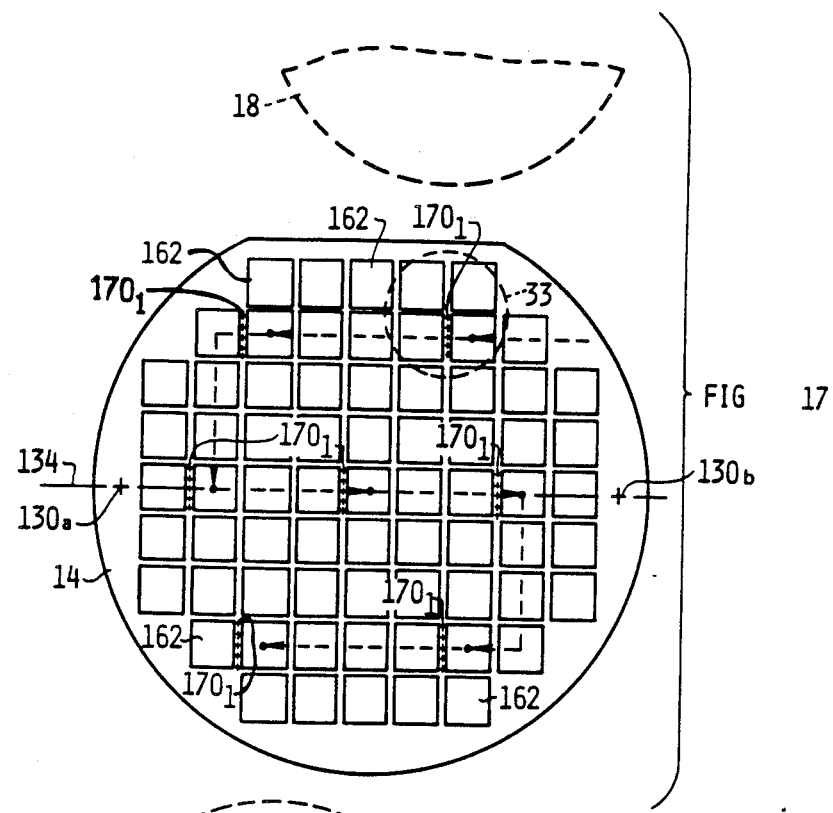
FIG. 17 is a top plan view of a semiconductive wafer illustrating the manner in which precision region-by-region alignment of the semiconductive wafer with respect to the main reticle or an image thereof may be performed utilizing the single channel auxiliary optical unit.

With reference now particularly to FIGS. 1, 2, 13, and 17, the precision region-by-region alignment operation may be performed by employing X and Y axes servo drive units 25 and 27 for moving main stage 20 to an initial position where a first selected region 162 in a first quadrant of the semiconductive wafer 14 is directly beneath the main objective lens 33 of single channel auxiliary optical unit 31 as generally indicated in FIG. 17 (the first selected region 162 being designated by the dot at the tip of the first arrowhead), and where the first precision wafer alignment mark $170_1$ associated with that selected region is in nominal alignment with the projected image of the wafer alignment mark 83 of auxiliary reticle 23 (this initial position being determined by the computer employed with the X and Y axes servo drive units); by employing single channel auxiliary optical unit 31 with binocular lens unit 93 to view the aerial image of the first precision wafer alignment mark $170_1$ associated with the first selected region 162 of the semiconductive wafer and illuminated by the projected image of wafer alignment mark 83 of the auxiliary reticle; while viewing that aerial image, by employing the X and Y axes servo drive units for moving the main stage to a position where the first precision wafer alignment mark $170_1$ associated with the first selected region of the semiconductive wafer is in precise alignment with (i.e., symmetrically centered within) the projected image of the wafer alignment mark 83 of the auxiliary reticle; and by employing the computer to determine and store the coordinate difference (i.e., the coordinate offset) between the initial position of the main stage where the first precision wafer alignment mark $170_1$ associated with the first selected region 162 of the semiconductive wafer is in nominal alignment with the projected image of the wafer alignment mark 83 of the auxiliary reticle and the last position of the main stage where that precision wafer alignment mark is in precise alignment with that projected image. Each of the preceding steps of this paragraph is repeated in exactly the same manner for the first precision wafer alignment mark $170_1$ associated with each of a second selected region 162 in a second quadrant, a third selected region 162 on the left hand side along the centerline 134, a fourth selected region 162 at the center, a fifth selected region 162 on the right hand side along the centerline 134, a sixth selected region 162 in a fourth quadrant, and a seventh selected region 162 in a third quadrant of the semiconductive wafer as indicated in FIG. 17 (these selected regions 162 being designated by dots at the tips of the second through the seventh arrowheads). The resulting seven coordinate differences or offsets (together with the coordinate difference representing the current relative spacing or offset between the images of the auxiliary reticle 23 and the second main reticle 12) are employed by the computer in determining the further positioning of main stage 20 so as to best compensate for these seven coordinate differences or offsets (in accordance with well known best fit equations for X and Y axes coordinate systems) during the subsequent step-and-repeat printing of the second level of microcircuitry contained on the second main reticle onto the semiconductive wafer 14.

As mentioned above the foregoing precision region-by-region alignment operation can be performed with greater precision (when not precluded from doing so because of interference patterns or the like) by employing X and Y axes servo drive units 25 and 27 for moving main stage 20 to an initial position where the first selected region 162 of the semiconductive wafer is directly beneath the projection lens 18 and where the associated first precision wafer alignment mark $170_1$ is in nominal alignment with an image of the corresponding precision wafer alignment mark 172 (of the second main reticle 12) to be projected onto the semiconductive wafer when that corresponding precision wafer alignment mark is illuminated; by employing controllable light source unit 24 for illuminating the precision wafer alignment mark 172 of the second main reticle with exposure light once the main stage has been moved to that initial position; by employing the projection lens with the right hand objective lens of dual channel objective lens unit 90 and with binocular lens unit 93 (slide 123 having been employed for moving beam bender 122 into the operative position) to view an aerial image of the first precision wafer alignment mark $170_1$ associated with the first selected region 162 of the semiconductive wafer and illuminated by the projected image of the corresponding precision wafer alignment mark 172 of the second main reticle; while viewing that aerial image, by employing the X and Y axes servo drive units for moving the main stage to a position where the first precision wafer alignment mark $170_1$ associated with the first selected region 162 of the semiconductive wafer is in precise alignment with (i.e., symmetrically centered within) the projected image of the corresponding precision wafer alignment mark 172 of the second main reticle; by causing the controllable light source unit to stop illuminating the precision wafer alignment mark 172 of the second main reticle; and by employing the computer to determine and store the coordinate difference or offset between the initial position of the main stage where the first precision wafer alignment mark $170_1$ associated with the first selected region 162 is in nominal alignment with the projected image of the corresponding precision wafer alignment mark 172 of the second main reticle and the last position of the main stage where that precision wafer alignment mark $170_1$ is in precise alignment with the projected image of that corresponding precision wafer alignment mark 172. Each of the preceding steps of this paragraph is repeated in exactly the same manner for the first precision wafer alignment mark $170_1$ associated with each of the six remaining selected regions 162, and the resulting seven coordinate differences or offsets are employed by the computer in determining the further positioning of main stage 20 as described above.

Although the precision region-by-region alignment operation has been described for the case of seven selected regions 162 of the semiconductive wafer 14 as indicated in FIG. 17, it may be performed for any number of selected regions 162 ranging from a minimum of one region 162 per wafer to a maximum of every region 162 of the desired array. In any case, the precision region-by-region alignment operation may be performed in the same manner prior to the step-and-repeat printing of each succeeding level of microcircuitry by employing the next succeeding precision wafer alignment mark of the set of precision wafer alignment marks 170 associated with each region 162 selected. Thus, for example, the second precision wafer alignment mark $170_2$ associated with each selected region 162 of each semiconductive wafer 14 is employed prior to the step-and-repeat printing of the third level of microcircuitry, and the third precision wafer alignment mark $170_3$ associated with each of those same regions 162 is employed prior to the step-and-repeat printing of the fourth level of microcircuitry. Accordingly, any impairment of the particular wafer alignment mark 170 employed during each precision region-by-region alignment operation as a result of the immediately following step-and-repeat printing and processing operations does not interfere with any subsequent precision region-by-region alignment operation. Such impairment may result when the precision region-by-region alignment operation is performed while employing the projection lens 18 due to illumination of the particular precision wafer alignment mark 170 being employed with exposure light, but does not result when that operation is performed while employing the single channel auxiliary optical unit 31 used only with nonexposure light (thereby permitting the same precision wafer alignment mark 170 to be employed for more than one precision region-by-region alignment operation). Since the operator typically knows in advance at which levels of microcircuitry it will be necessary to employ the single channel auxiliary optical unit 31 while performing the precision region-by-region alignment operation, and since that operation will not typically be required prior to the step-and-repeat printing of some levels of microcircuitry (also typically known in advance by the operator), the number of precision wafer alignment marks 170 actually printed alongside each region 162 of the semiconductive wafer 14 may be reduced accordingly.

Figure 18:
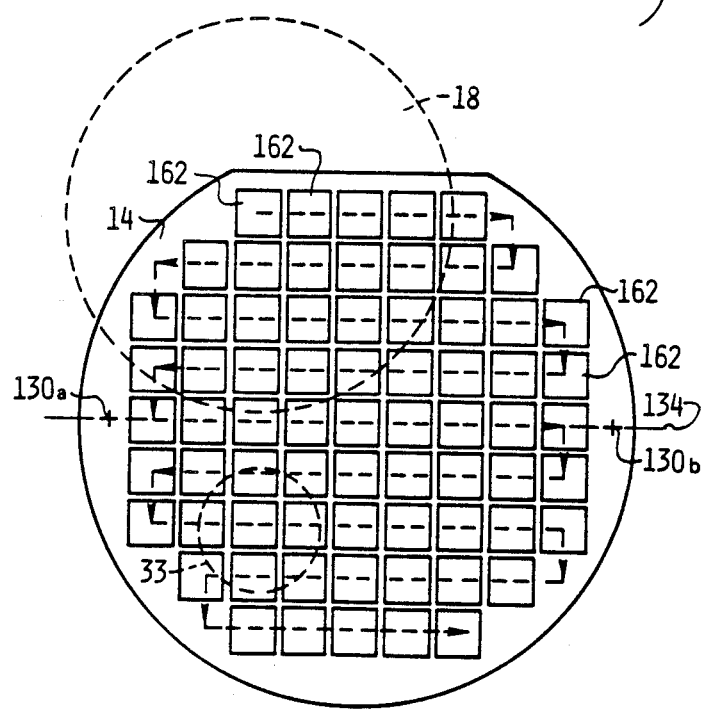
FIG. 18 is a top plan view of a semiconductive wafer illustrating the manner in which a step-and-repeat printing operation is performed on the semiconductive wafer with the projection lens of the step-and-repeat alignment and exposure system of FIGS. 1 and 2.

Upon completion of the above-described precision region-by-region alignment operation, another step-and-repeat printing operation is performed to photometrically print the second level of microcircuitry contained on the square central region 160 of the second main reticle 12 at each of the desired array of adjacent regions 162 of the semiconductive wafer 14 in precision alignment with the first level of microcircuitry previously printed and formed at each of those same regions 162. With reference particularly to FIGS. 1, 2, 12 and 18, the manner in which every step-and-repeat printing operation is performed by alignment and exposure system 10 will now be described as performed for the second level of microcircuitry on the first semiconductive wafer of the batch. This step-and-repeat printing operation is performed by employing X and Y axes servo drive units 25 and 27 to step a first one of the desired array of adjacent regions 162 of the semiconductive wafer 14 directly beneath projection lens 18 (as generally indicated in FIG. 18) with the first level of microcircuitry previously printed and formed at that region in precise alignment with an image of the second level of microcircuitry (contained on the square central portion 160 of the second main reticle 12) to be projected onto that region when the central microcircuitry-containing area of the second main reticle is illuminated; by thereupon employing controllable light source unit 24 to momentarily illuminate the central microcircuitry-containing central area of the second main reticle with exposure light, thereby selectively exposing the photosensitive film on the semiconductive wafer so as to print the second level of microcircuitry contained on the second main reticle at the first region 162 of the semiconductive wafer in alignment with the first level of microcircuitry previously formed at that region 162; and by repeating each of the preceding steps of this paragraph for every remaining region 162 of the semiconductive wafer in the order indicated in FIG. 18.

The first semiconductive wafer 14 of the batch of semiconductive wafers is removed from alignment and exposure system 10 following the step-and-repeat printing thereon of the second level of microcircuitry contained on the second main reticle 12 of the set. Alignment and exposure system 10 is thereupon employed to perform the above-described global alignment, precision region-by-region alignment, and step-and-repeat printing operations on each of the remaining semiconductive wafer 14 of the batch to photometrically print the second level of microcircuitry (contained on the second main reticle 12 of the set) at the desired array of adjacent regions 162 of each of those semiconductive wafers in precise alignment with the first level of microcircuitry (contained on the first main reticle 12 of the set) previously formed at the same desired array of adjacent regions 162 of each of those semiconductive wafers. All of the semiconductive wafers 14 of the batch are subsequently processed as previously described to form the second level of microcircuitry on each semiconductive wafer at each of the desired array of adjacent regions 162 and are then covered with a photosensitive film in preparation for the step-and-repeat printing of the third level of microcircuitry contained on the third main reticle 12 of the set.

Alignment and exposure system 10 is employed to perform a main reticle alignment operation on each remaining main reticle of the set in the same manner as previously described and, for every remaining main reticle so aligned, to successively perform a global alignment, precision region-by-region alignment (as required and step-and-repeat printing operation on each semiconductive wafer 14 of the batch in the same manner as previously described. The level of microcircuitry contained on each remaining main reticle 12 is therefore photometrically printed and may be subsequently formed at the desired array of adjacent regions 162 of each semiconductive wafer 14 in precise alignment with the levels of microcircuitry previously printed and formed at the same desired array of adjacent regions 162 of each semiconductive wafer. Following all of the foregoing processing operations, each semiconductive wafer may be scribed alongside each row and column of the desired array of adjacent regions 162 of the semiconductive wafer so as to form a plurality of individual die each containing one of the regions 162. These dice are then typically subjected to die bonding, wire bonding, and other well known processing operations to form integrated circuits or the like.

We claim:

1. Alignment apparatus for interchangeably aligning an object with respect to images of first and second elements, said apparatus comprising:
    a first holder for holding the first element;
    a first optical unit for producing an image of the first element at an image plane;
    a second holder, spaced from the first holder, for holding the second element;
    a second optical unit, spaced from the first optical unit, for producing and image of the second elememt at the image plane;
    a third holder for holding the object;
    a stage, movable along coordinate axes, for permitting relative movement between the object and both images of the first and second elements so that the object may be aligned with respect to the image of the first element and also with respect to the image of the second element; and
    light source means for selectively illuminating the entire field of view of the second optical unit with light not passing through the second element.

2. Alignment apparatus for interchangeably aligning an object with respect to images of first and second elements, said apparatus comprising:
    a first holder for holding the first element;
    a first optical unit for producing an image of the first element at an image plane;
    a second holder, spaced from the first holder, for holding the second element;
    a second optical unit, spaced from the first optical unit, for producing an image of the second element at the image plane;
    a third holder for holding the object;
    a stage movable along coordinate axes, for permitting relative movement between the object and both images of the first and second elements so that the object may be aligned with respect to the image of the first element and also with respect to the image of the second element; and
    means for detecting a reference position for the coordinate axes of motion of the stage.

* * * * *